United States Patent
Inoue et al.

(10) Patent No.: US 10,224,512 B2
(45) Date of Patent: Mar. 5, 2019

(54) ORGANIC ELECTROLUMINESCENT DEVICE AND METHOD FOR PRODUCING ORGANIC ELECTROLUMINESCENT DEVICE

(71) Applicant: Sharp Kabushiki Kaisha, Osaka (JP)

(72) Inventors: Satoshi Inoue, Osaka (JP); Katsuhiro Kikuchi, Osaka (JP); Hideki Uchida, Osaka (JP); Eiji Koike, Osaka (JP); Masanori Ohara, Osaka (JP); Yuto Tsukamoto, Osaka (JP); Yoshiyuki Isomura, Osaka (JP); Kazuki Matsunaga, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/511,504

(22) PCT Filed: Sep. 15, 2015

(86) PCT No.: PCT/JP2015/076100
§ 371 (c)(1),
(2) Date: Mar. 15, 2017

(87) PCT Pub. No.: WO2016/043175
PCT Pub. Date: Mar. 24, 2016

(65) Prior Publication Data
US 2017/0263896 A1    Sep. 14, 2017

(30) Foreign Application Priority Data
Sep. 18, 2014    (JP) .................................. 2014-189920

(51) Int. Cl.
H01L 29/08    (2006.01)
H01L 35/24    (2006.01)
(Continued)

(52) U.S. Cl.
CPC ...... *H01L 51/5271* (2013.01); *H01L 27/3246* (2013.01); *H01L 27/3272* (2013.01);
(Continued)

(58) Field of Classification Search
CPC ............. H01L 51/5271; H01L 27/3272; H01L 27/3283; H01L 27/3246; H01L 51/56; H01L 2251/5315
See application file for complete search history.

(56) References Cited

U.S. PATENT DOCUMENTS 10,090,489 B2 * 10/2018 Uchida ...................... G09F 9/30
2014/0264291 A1 * 9/2014 Zhang .................. H01L 51/5271
257/40

(Continued)

FOREIGN PATENT DOCUMENTS

| JP | 2003-229283 A | 8/2003 |
| JP | 2004-119147 A | 4/2004 |

(Continued)

*Primary Examiner* — Ismail A Muse
(74) *Attorney, Agent, or Firm* — ScienBiziP, P.C.

(57) ABSTRACT

The organic EL device includes a base material, a recessed portion, a reflective layer provided along an inner face of the recessed portion, a filling layer having optical transparency, and filled and disposed at an inside of the recessed portion, with the reflective layer interposed between the recessed portion and the filling layer, a first electrode having optical transparency and provided at an upper-layer side of the filling layer, an organic layer including a light-emitting layer and provided at an upper-layer side of the first electrode, a second electrode having optical transparency and optical reflectivity and provided at an upper-layer side of the organic layer. At least a portion of an edge of the light-emitting region is positioned further inside than an edge of (Continued)

the recessed portion, and the reflective layer and the first electrode are in contact with each other at the periphery of the recessed portion.

20 Claims, 15 Drawing Sheets

(51) Int. Cl.
| | |
|---|---|
| *H01L 51/00* | (2006.01) |
| *H01L 51/52* | (2006.01) |
| *H05B 33/24* | (2006.01) |
| *H01L 27/32* | (2006.01) |
| *H01L 51/56* | (2006.01) |

(52) U.S. Cl.
CPC .......... *H01L 27/3283* (2013.01); *H01L 51/56* (2013.01); *H05B 33/24* (2013.01); *H01L 2251/5315* (2013.01)

(56) References Cited

U.S. PATENT DOCUMENTS

| | | | | |
|---|---|---|---|---|
| 2017/0256748 | A1* | 9/2017 | Koike | H01L 51/5036 |
| 2017/0280530 | A1* | 9/2017 | Matsunaga | H05B 33/0896 |
| 2017/0317148 | A1* | 11/2017 | Uchida | H01L 27/3211 |
| 2017/0325314 | A1* | 11/2017 | Uchida | G09F 9/30 |
| 2018/0097195 | A1* | 4/2018 | Inoue | H01L 51/5012 |
| 2018/0212198 | A1* | 7/2018 | Inoue | H05B 33/02 |
| 2018/0226615 | A1* | 8/2018 | Uchida | G09F 9/30 |
| 2018/0269428 | A1* | 9/2018 | Uchida | G02B 5/20 |
| 2018/0287099 | A1* | 10/2018 | Uchida | G02B 5/20 |

FOREIGN PATENT DOCUMENTS

| | | |
|---|---|---|
| JP | 2005-331665 A | 12/2005 |
| JP | 2011-228229 A | 11/2011 |

* cited by examiner

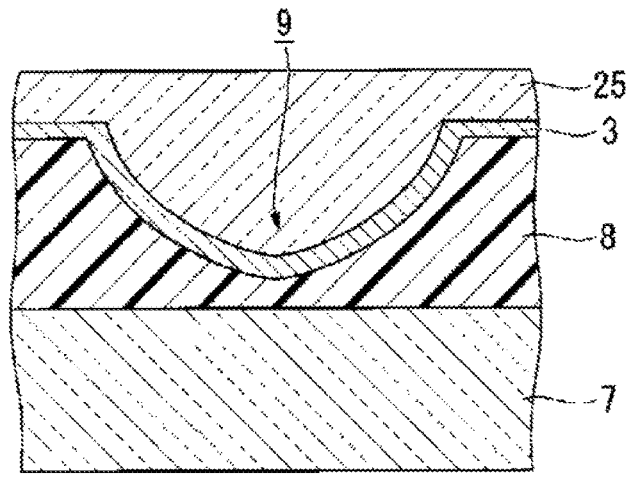
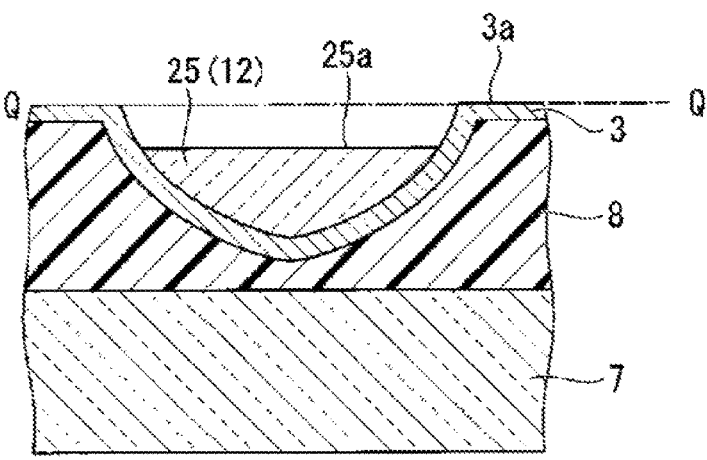
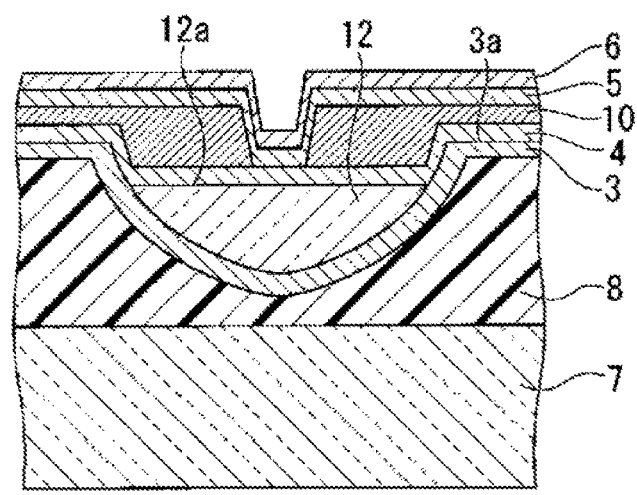

ORGANIC ELECTROLUMINESCENT DEVICE AND METHOD FOR PRODUCING ORGANIC ELECTROLUMINESCENT DEVICE

TECHNICAL FIELD

The present disclosure relates to an organic electroluminescent device and a method for producing an organic electroluminescent device.

This application claims priority from Japanese Patent Application No. 2014-189920, filed Sep. 18, 2014, the entirety of which is incorporated by reference herein.

BACKGROUND ART

A known embodiment of a display device is a self-emitting display device such as an organic electroluminescent display device. Electroluminescence is shortened to "EL" hereafter. In organic EL display devices, light emitted from a light-emitting layer advances in all directions and some of the light is totally reflected due to a difference between the refractive index of the light-emitting element and the refractive index of external space (air). Much of the light totally reflected by the interface between the light-emitting element and the air is trapped within the light-emitting element and is not extracted to the external space. For example, if the refractive index of the light-emitting layer is 1.8, then out of the light emitted from the light-emitting layer, approximately 20% of the light is extracted to the external space from the light-emitting layer and the remaining 80% of the light is trapped in the light-emitting layer. Thus, conventional organic EL devices have a problem of light utilization efficiency being low.

PTL 1 below describes an organic EL display device including a support substrate, an organic EL element provided on the support substrate, and a light reflection layer reflecting light emitted by the organic EL element. In the light reflection layer, the organic EL display device is provided with concave parts including inclined faces along the outer edge of an organic light-emitting layer. Light emitted from the organic light-emitting layer is reflected by the inclined faces of the concave parts and then returns toward the organic EL element. It is stated that this configuration can prevent image quality degradation such as bleeding, and can improve light utilization efficiency

CITATION LIST

Patent Literature

PTL 1: Japanese Unexamined Patent Application Publication No. 2003-229283A

SUMMARY

Technical Problem

However, even in the organic EL display device described in PTL 1, much light is trapped in the interior of the organic light-emitting layer and the improvement effect on the light utilization efficiency is still insufficient. Although the example of an organic EL display device is given here, the problem of low light utilization efficiency is not limited to display device applications. Illuminating device applications share the same problem.

One aspect of the present invention is an organic EL device with excellent light utilization efficiency, and a method for producing the organic EL device.

Solution to Problem

An organic electroluminescent device of one aspect of the present invention includes a base material, a first recessed portion, a reflective layer, a filling layer, a first electrode, an organic layer, and a second electrode. The first recessed portion is provided in an upper face of the base material. The reflective layer is provided along at least an inner face of the first recessed portion. The filling layer has optical transparency and is filled and disposed at an inside of the first recessed portion with the reflective layer interposed between the first recessed portion and the filling layer. The first electrode has optical transparency and is provided at least at an upper-layer side of the filling layer. The organic layer includes a light-emitting layer and is provided at an upper-layer side of the first electrode. The second electrode has optical transparency and optical reflectivity, and is provided at an upper-layer side of the organic layer. In the organic electroluminescent device of this aspect, a light-emitting region is formed by layers of the first electrode, the organic layer, and the second electrode, and at least a portion of an edge of the light-emitting region is positioned further inside than an edge of the first recessed portion, as viewed in a direction normal to the upper face. The reflective layer and the first electrode are in contact with each other at a periphery of the first recessed portion.

An organic electroluminescent device of one aspect of the present invention may be configured such that an insulating layer is provided at the upper-layer side of the first electrode and at a lower-layer side of the second electrode. The insulating layer includes an opening at a position overlapping with the first recessed portion, as viewed in the direction normal to the upper face. The light-emitting region may be configured inside the opening by a layered body of layers of the first electrode, the organic layer, and the second electrode.

An organic electroluminescent device of one aspect of the present invention may be configured such that the entire edge of the opening is positioned inside the entire edge of the first recessed portion, as viewed in the direction normal to the upper face.

An organic electroluminescent device of one aspect of the present invention may be configured such that a second recessed portion is provided in the upper face of the base material in a region where the insulating layer is formed, and such that the reflective layer is provided along an inner face of the second recessed portion.

An organic electroluminescent device of one aspect of the present invention may be configured such that, as viewed in the direction normal to the upper face, a plurality of the first recessed portions are provided at a spacing from each other in at least one azimuth direction, and one or the plurality of the second recessed portions are provided between two first recessed portions of the plurality of the second recessed portions that are adjacent to each other.

An organic electroluminescent device of one aspect of the present invention may be configured such that at least a portion of a cross-section profile of the first recessed portion sectioned along at least one plane out of a plurality of planes orthogonal to the upper face of the base material includes a curved line including a focal point, and the focal point is positioned in an interior of the light-emitting region.

An organic electroluminescent device of one aspect of the present invention may be configured such that the curved line is a parabolic line.

An organic electroluminescent device of one aspect of the present invention may be configured such that a lower face of the first electrode in the first recessed portion is positioned lower than a plane including the upper face.

An organic electroluminescent device of one aspect of the present invention may be configured such that a lower flux of the light-emitting layer in the first recessed portion is positioned lower than a plane including the upper face.

An organic electroluminescent device of one aspect of the present invention may be configured further including a plurality of unit display regions, and may be configured such that each of the plurality of unit display regions includes at least the first recessed portion.

An organic electroluminescent device of one aspect of the present invention may be configured such that the plurality of unit display regions are disposed in a matrix arrangement.

A method for producing an organic electroluminescent device of one aspect of the present invention includes the following: forming a first recessed portion in an upper face of a base material; forming a reflective layer along at least a surface of the first recessed portion; forming a filling layer at an inside of the first recessed portion with the reflective layer interposed between the first recessed portion and the filling layer, the filling layer having optical transparency; forming a first electrode at least at an upper-layer side of the filling layer, the first electrode having optical transparency; forming, at an upper-layer side of the first electrode, an insulating layer including an opening at a position overlapping the first recessed portion, as viewed in a direction normal to the upper face; forming an organic layer at an upper-layer side of the insulating layer or between the first electrode and the insulating layer, the organic layer including a light-emitting layer; and forming a second electrode at the upper-layer side of the organic layer or at an upper-layer side of the insulating layer, the second electrode having optical transparency and optical reflectivity. In this method, a configuration is made such that a light-emitting region is configured inside the opening by a layered body of layers of the first electrode, the organic layer, and the second electrode and, as viewed in the direction normal to the upper face, at least a portion of an edge of the light-emitting region is positioned further inside than an edge of the first recessed portion. Moreover, a configuration is made such that the reflective layer and the first electrode are in contact with each other at a periphery of the first recessed portion.

Advantageous Effects of Invention

One aspect of the present invention enables an organic EL device with excellent light utilization efficiency to be realized.

BRIEF DESCRIPTION OF DRAWINGS

FIGS. 6A to 6C are cross-section views illustrating a first example of the production process continuing from the production process of FIGS. 5A to 5D.

DESCRIPTION OF EMBODIMENTS

First Embodiment

A description follows regarding a first embodiment of the present invention, with reference to FIG. 1 to FIG. 10.

The organic EL device of the first embodiment is an example of a top-emitting organic EL device.

Figure 1:
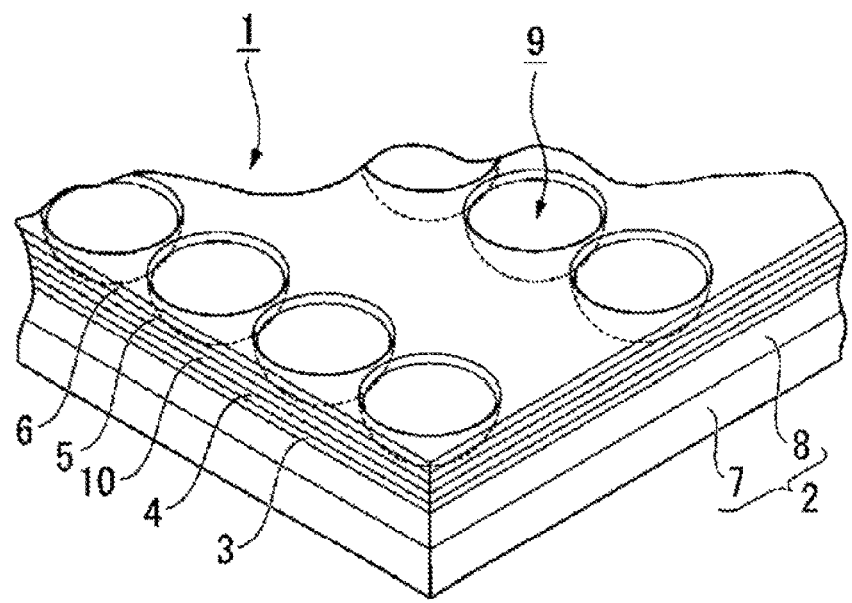
FIG. 1 is a perspective view illustrating an organic EL device of a first embodiment.

FIG. 1 is a perspective view of an organic EL device of the first embodiment.

Note that in each of the figures below, the dimensional scale is illustrated differently depending on the component, so that each component is easily visible.

As illustrated in FIG. 1, an organic EL device 1 of the present embodiment includes a base material 2, a reflective layer 3, a first electrode 4, an insulating layer 10, an organic layer 5 including a light-emitting layer, and a second electrode 6. The organic EL device 1 is a top-emitting organic EL device in which light emitted by the light-emitting layer is emitted from the second electrode 6 side. The base material 2 includes a substrate 7 and a foundation layer 8. The foundation layer 8, the reflective layer 3, the first, electrode 4, the insulating layer 10, the organic layer 5, and the second electrode 6 are layered onto the upper face of the substrate 7 in this order from the substrate 7 side. A plurality of recessed portions 9 are provided in the upper face (light-emitting face) of the organic EL device 1.

The organic EL device 1 of the present embodiment is, for example, a green light-emitting element configured to emit green light. Alternatively, the organic EL device 1 may be a red light-emitting element configured to emit red light or a blue light-emitting element configured to emit blue light. Green light-emitting elements, red light-emitting elements, and blue light-emitting elements differ only in the materials configuring the light-emitting layer, and share the same configuration in other respects. Moreover, the organic EL device 1 may, for example, be configured to emit red light, green light, and blue light simultaneously. In such cases, the organic EL device 1 may, for example, be employed as an illumination device configured to emit white light. However, applications of the organic EL device 1 are not limited to illumination devices. For example, a red light-emitting element, a green light-emitting element, and a blue light-emitting element may each be made smaller and employed as a red subpixel, a green subpixel, and a blue subpixel, respectively. The organic EL device 1 may be applied to a display device in which one pixel is configured by these three subpixels.

Figure 2:
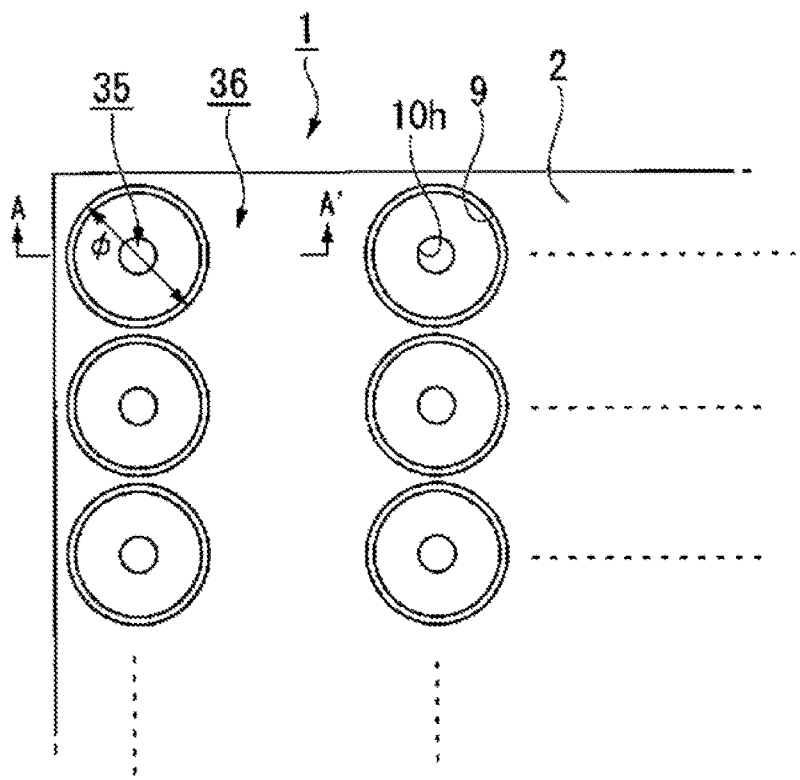
FIG. 2 is a plan view of an organic EL device.

FIG. 2 is a plan view viewed in a direction normal to the upper face of the organic EL device 1, and illustrates a portion of the organic EL device 1 enlarged.

The planar shape of the organic EL device 1 is a square, and the dimension of one side of the square is, for example, approximately 2 mm.

As illustrated in FIG. 2, the organic EL device 1 includes the base material 2 and the plurality of recessed portions 9 provided in the base material 2. The planar shape of each recessed portion 9 as viewed in the direction normal to the upper face of the base material 2 is a circle, The diameter φ of the recessed portion 9 is, for example, approximately 5 μm. The plurality of recessed portions 9 are regularly disposed in vertical and horizontal directions. The plurality of recessed portions 9 are disposed close to each other in the vertical direction and are separated from each other by a predetermined distance in the horizontal direction. Moreover, each of openings 10h in the insulating layer 10 is provided at the corresponding position overlapping with the corresponding recessed portion 9. The planar shape of each opening 10h is a circle. The entire edge of each opening 10h is positioned inside the entire edge of the corresponding recessed portion 9. The diameter of the opening 10h is, for example, approximately 1 μm.

The recessed portion 9 of the present embodiment corresponds to a first recessed portion in the scope of the claims.

Figure 3:
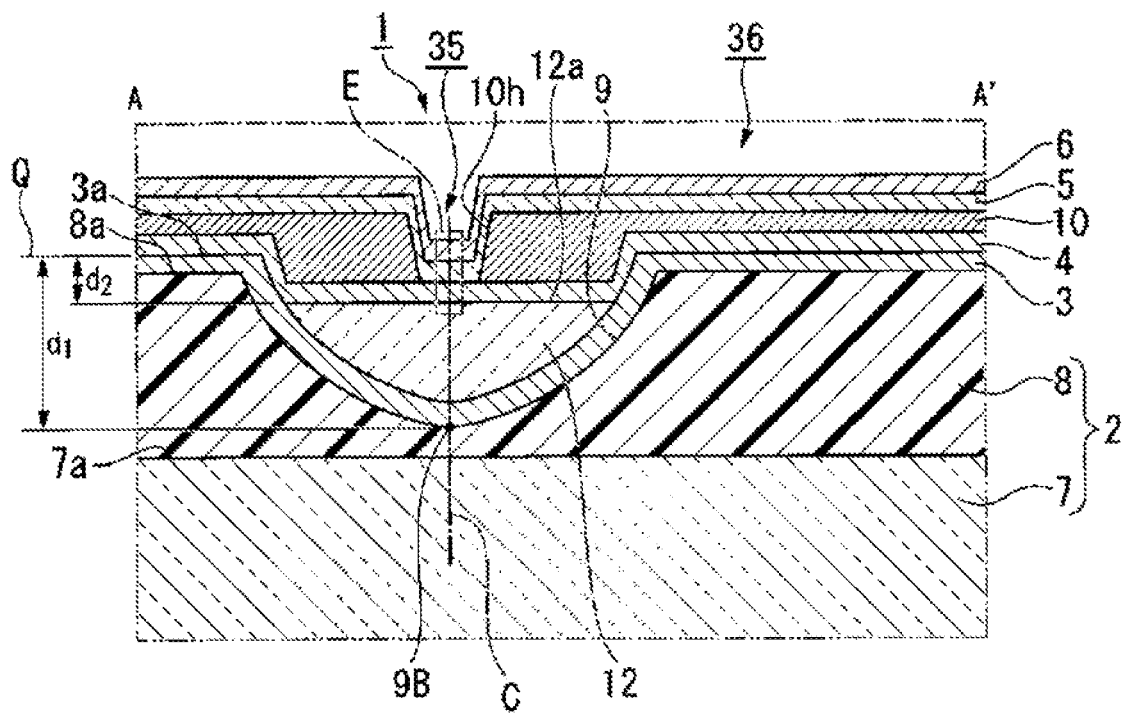
FIG. 3 is a cross-section view taken along line A-A' of FIG. 2.

FIG. 3 is a cross-section view of the organic EL device 1 sectioned along a plane orthogonal to the upper face of the base material 2 and a cross-section view taken along line A-A' of FIG. 2.

As illustrated in FIG. 3, the foundation layer 8 is layered onto an upper face 7a of the substrate 7. For example, a glass substrate is employed as the material of the substrate 7. Note that since the organic EL device 1 is a top-emitting organic EL device, the substrate 7 does not necessarily need to have optical transparency, and, for example, a semiconductor substrate such as a silicon substrate may be employed.

The recessed portions 9 are provided in a portion of an upper face 8a of the foundation layer 8 with their openings facing upward. The region of the upper face 8a of the foundation layer 8 other than the region where the recessed portions 9 are provided is a planar face. The cross-section profile of each recessed portion 9 includes at least a portion of a curved line that includes a focal point. More specifically, in the case of the present embodiment, the inner face of the recessed. portion 9 is a parabolic face having rotational symmetry about a straight line C passing through a lowest point 9B of the center of the recessed portion 9 and orthogonal to the upper face 7a of the substrate 7. Accordingly, as long as the cross-section profile of the recessed portions 9 is in a plane orthogonal to the upper face 7a of the substrate 7, the same parabolic line is given regardless of the direction of the plane that the cross-section is sectioned along. In the following description, the shape of the recessed portion is also referred to as a shape of a parabola.

Although in the present embodiment, a parabolic line is employed as the curved line that includes the focal point, other than a parabolic line, for example, another conic line such as an elliptical or a hyperbolic line that includes the focal point may be employed. Moreover, although there are an infinite number of planes orthogonal to the upper face of the base material, it is sufficient as long as at least a portion of the curved line that includes the focal point lies in the cross-section profile of the recessed portion sectioned along at least one plane. For example, the upper side of the recessed portion may be inclined in a straight line shape.

The foundation layer 8 is configured by a photosensitive resin, such as an acrylic, an epoxy, or a polyimide resin. Employing a photosensitive resin in the material of the foundation layer 8 is well-suited to the method for forming the recessed portions 9, described later. However, when a method other than the forming method described later is applied, the material configuring the foundation layer 8 need not necessarily be photosensitive. Moreover, the material configuring the foundation layer 8 need not be a resin, and an inorganic material may be employed. Although the base material 2 employed in the present embodiment is fanned of the substrate 7 and the foundation layer 8, a foundation layer need not necessarily be employed, and the recessed portions may be formed in the substrate 7 itself.

The reflective layer 3 is formed on the upper face 8a of the foundation layer 8 including the inner face of the recessed portions 9. A metal having high reflectance such as aluminum or silver is preferably used as the material configuring the reflective layer 3. In the case of the present embodiment, the reflective layer 3 is configured by, for example, an aluminum film having a film thickness of 100 nm.

A filling layer 12 is filled into the inside of each of the recessed portions 9 with the reflective layer 3 interposed therebetween. An upper face 12a of the filling layer 12 is positioned lower than a plane Q including a planar face 3a of the reflective layer 3. Although the upper face 12a of the filling layer 12 is preferably positioned lower than the plane Q including the planar face 3a of the reflective layer 3, even when the upper face 12a of the filling layer 12 is at the highest position, the position of the upper face 12a of the filling layer 12 would only be at the same height as the plane Q. In other words, the filling layer 12 is never formed so as to rise above the plane Q. The filling layer 12 is configured by a resin having optical transparency. More specifically, a resin such as acrylic, epoxy, or polyimide is employed in the material of the filling layer 12. The refractive index of the filling layer 12 of the present embodiment is, for example, 1.5.

The first electrode 4 is formed across the upper face 12a of the filling layer 12 and the planar face 3a of the reflective layer 3. The first electrode 4 includes a step in the portion at the edge of the recessed portion 9. A portion of the first electrode 4 positioned at the upper face 8a of the foundation layer 8 is in contact with a portion of the reflective layer 3. The lower face of the first electrode 4 is in contact with the upper face 12a of the filling layer 12 at a position inside the recessed portion 9. Accordingly, the lower face of the first electrode 4 is in a lower position than the plane Q including the planar face 3a of the reflective layer 3. The first electrode 4 is a transparent electrode configured by a transparent, conductive film such as indium tin oxide (ITO) or indium zinc oxide (IZO), and has optical transparency. In the case of the present embodiment, the first electrode 4 is configured by, for example, ITO having a film thickness of 120 nm. The first electrode 4 functions as an anode for injecting holes into the organic layer.

The insulating layer 10 is formed on the upper face of the first electrode 4. The insulating layer 10 includes the openings 10h above the corresponding recessed portions 9, and each of the openings 10h has a smaller diameter than that of the corresponding recessed portion 9. Similar to the filling layer 12, a resin such as acrylic, epoxy, or polyimide is employed in the material of the insulating layer 10. The insulating layer 10 is interposed between the first electrode 4 and the second electrode 6 (more precisely, between the first electrode 4 and the organic layer 5), and the insulating layer 10 blocks the migration of holes from the first electrode 4 to the organic layer 5. Thus, a region where the insulating layer 10 is interposed between the first electrode 4 and the second electrode 6 is a non-light-emitting region 36 where emission of light from the light-emitting layer does not occur. On the other hand, the region of the opening 10h of the insulating layer 10 is a light-emitting region 35 where light emission occurs because the first electrode 4, the organic layer 5, and the second electrode 6 are layered together with no insulating layer 10 therebetween. The planar shape and dimensions of the light-emitting region 35 are defined by the opening 10h of the insulating layer 10. The step of the first electrode 4 at the portion of the edge of the recessed portion 9 is leveled by the insulating layer 10.

The organic layer 5 is layered across the upper face of the first electrode 4. The organic layer 5 is a layered body formed of an organic material. The organic layer 5 includes a hole injecting layer, a hole transport layer, a light-emitting layer, an electron transport layer, and an electron injecting layer. The lower face of the organic layer 5 in the light-emitting region 35 is positioned lower than the plane Q including the planar face 3a of the reflective layer 3. Detailed description of the configuration and functioning of each layer configuring the organic layer 5 is given later.

The second electrode 6 is layered across the upper face of the organic layer 5. The second electrode 6 is a semitransparent electrode configured by a metal thin film such as silver or a magnesium silver alloy. Namely, the second electrode 6 has both optical transparency and optical reflectivity, and transmits sonic incident light, and reflects the remainder. Metals having a low work function are preferably used for the second electrode 6, and, for example, Ag, Al, a magnesium alloy (such as MgAg), an aluminum alloy (such as AlLi, AlCa, or AlMg), or the like is employed. In the case of the present embodiment, the second electrode 6 is, for example, configured by a layered film of MgAg alloy having a film thickness of 1 nm and a film of Ag having a film thickness of 19 nm. The second electrode 6 functions as a cathode for injecting electrons into the organic layer 5. Moreover, although omitted from the illustration in FIG. 3, an optical adjustment layer known as a cap layer is layered onto the upper face of the second electrode 6.

Figure 4:
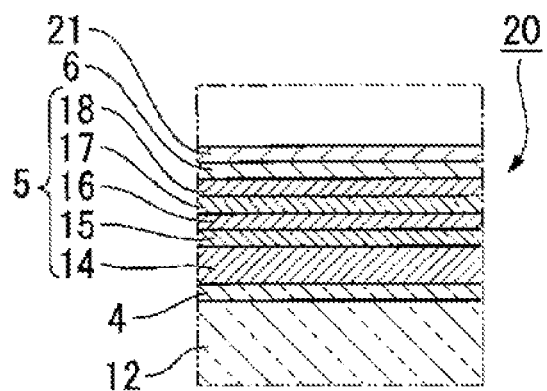
FIG. 4 is a cross-section view illustrating a detailed configuration of an organic layer.

FIG. 4 is a cross-section view illustrating a detailed configuration of the organic layer 5. In FIG. 4, a portion of the light-emitting region 35 in FIG. 3 assigned the reference sign E is illustrated enlarged.

As illustrated in FIG. 4, the organic layer 5 is provided as a layer on the first electrode 4. The organic layer 5 is configured by a layered film including a hole injecting layer 14, a hole transport layer 15, a light-emitting layer 16, an electron transport layer 17, and an electron injecting layer 18 layered from the first electrode 4 side thereof. However, layers other than the light-emitting layer 16 may be appropriately introduced if necessary. A single layer may serve as both a transport layer and an injecting layer. In the present embodiment, as described above, an example is given of an organic layer having a 5-layer structure of the hole injecting layer 14, the hole transport layer 15, the light-emitting layer 16, the electron transport layer 17, and the electron injecting layer 18. Moreover, if necessary, a layer for preventing migration of charge to the opposite side electrode, such as a hole blocking layer or an electron blocking layer, may be appropriately added.

The hole injecting layer 14 is a layer that functions to increase the efficiency of injecting holes from the first electrode 4 to the light-emitting layer 16. Examples that may be employed as the material of the hole injecting layer 14 include benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, and derivatives thereof; and heterocyclic, conjugated monomers, oligomers, polymers, and the like of an polysilane-based compound, a vinylcarbazole-based compound, a thiophene-based compound, an aniline-based compound, or the like. Molybdenum oxide may be blended with these organic materials. The blending ratio of the organic material and the molybdenum oxide is, for example, approximately 80% organic material, and approximately 20% molybdenum oxide. The thickness of the hole injecting layer 14 is, for example, approximately 70 nm.

The hole transport layer 15 is a layer that functions to increase the efficiency of hole transport from the first electrode 4 to the light-emitting layer 16. An organic material similar to the hole injecting layer 14 may be employed in the hole transport layer 15. Note that the hole injecting layer 14 and the hole transport layer 15 may be a single body, or may be formed as individual layers. The thickness of the hole transport layer 15 is, for example, approximately 10 mm The light-emitting layer 16 functions to emit light when holes injected from the first electrode 4 side recombine with electrons injected from the second electrode 6 side, and the holes and the electrons release energy. The material of the light-emitting layer 16 is configured by, for example, a host material and a dopant material. The material of the light-emitting layer 16 may also include an assist material. The host material is included at the highest ratio among the configuring materials in the light-emitting layer 16. For example, the blending ratio of the host material and the dopant material is approximately 90% host material and approximately 10% dopant material. The host material is easily formed into the film of the light-emitting layer 16 and functions to maintain the film state of the light-emitting layer 16. Accordingly, it is desirable that the host material is a stable compound that does not easily crystalize after film formation and does not easily undergo chemical change. Moreover, when an electric field is applied between the first electrode 4 and the second electrode 6, the host material functions such that recombination of carriers occurs within the host molecules, and excitation energy is transferred to the dopant material, causing the dopant material to emit light. In the case of the present embodiment, a bipolar material is employed in the host material, and a phosphorescent material is employed in the dopant material. The thickness of the light-emitting layer 16 is, for example, approximately 60 nm.

Specific examples of materials of the light-emitting layer 16 include materials that include a material having a high light-emission efficiency, such as a low molecular fluorescent colorant, a fluorescent macromolecule, or a metal complex. Examples of the material of the light-emitting layer 16 include anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, and derivatives thereof; tris(8-quinolinato)aluminum complex; bis(benzoquinolinato)beryllium complex; tri(dibenzoylmethyl)phenanthroline europium complex; and ditoluylvinylbiphenyl.

The electron transport layer 17 functions to increase the efficiency of electron transport from the second electrode 6 to the light-emitting layer 16. As the material of the electron transport layer 17, for example, quinoline, perylene, phenanthroline, bisstyryl, pyrazine, triazole, oxazole, oxadiazole, fluorenone, and derivatives and metal complexes thereof can be employed. Specifically, for example, tris(8-hydroxyquinoline)aluminum, anthracene, naphthalene, phenanthrene, pyrene, perylene, butadiene, coumarin, acridine, stilbene, 1,10-phenanthroline, and derivatives and metal complexes thereof can be employed. The thickness of the electron transport layer 17 is, for example, approximately 15 nm.

The electron injecting layer 18 functions to increase the efficiency of electron injection from the second electrode 6 to the light-emitting layer 16. As the material of the electron injecting layer 18, for example, compounds such as calcium metal (Ca) or lithium fluoride (LiF) can be employed. Note that the electron transport layer 17 and the electron injecting layer 18 may be a single body, or may be formed as individual layers. The thickness of the electron injecting layer 18 is, for example, approximately 0.5 nm.

A cap layer 21 is layered onto the upper face of the second electrode 6. The cap layer 21 functions as a protective layer protecting the second electrode 6 and functions as an optical adjustment layer. Note that a color filter may be added at an upper-layer side of the second electrode 6. The color filter transmits light emitted from the organic layer 5, enabling the color purity of the emitted light to be raised.

One example of a specific configuration of the organic EL device 1 is given in Table 1.

TABLE 1

|  | Green color unit emission region |
| --- | --- |
| Anode | ITO: 120 nm |
| Hole injecting layer | Organic HTL material (80%):MoOx (20%) 70 nm |
| Hole transport layer | Organic HTL material 10 nm |
| Light-emitting layer | H(90%):d(10%) 60 nm H: bipolar material d: phosphorescent material |
| Electron transport layer | Organic ETL material 15 nm |
| Electron injecting layer | LiF 0.5 nm |
| Cathode | MgAg 1 nm/Ag 19 nm |
| Cap layer | 78 nm |

Light-emitting layer H (host material), d (dopant material)

Descriptions follows regarding a process for producing the organic EL device 1 having the above configuration, with reference to FIGS. 5A to 8B. In particular, a description follows focusing on a method for forming the recessed portions 9.

Figure 5A:
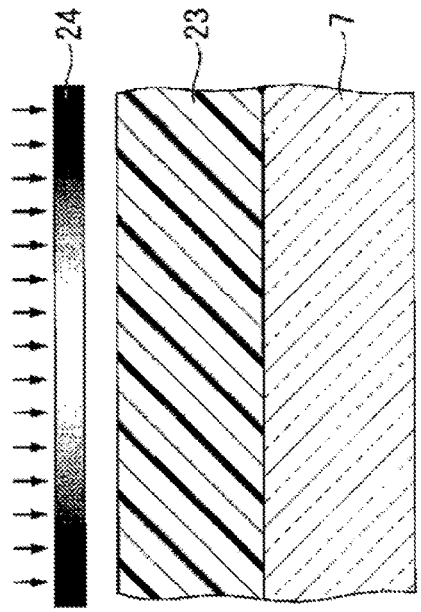
FIGS. 5A to 5D are cross-section views illustrating a process for producing an organic EL device.

First, as illustrated in FIG. 5A, a positive-type photosensitive resin material is coated onto the first face 7a of the substrate 7, and a resin layer 23 is formed.

Figure 5B:
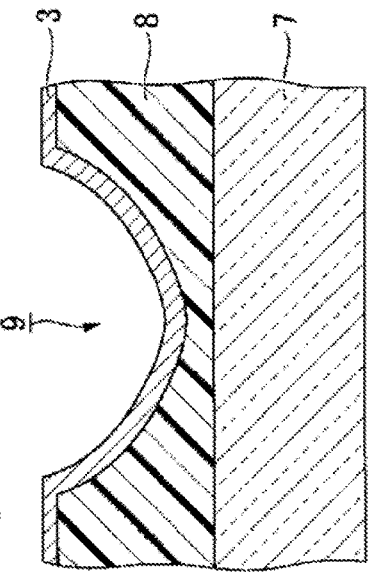

Next, as illustrated in FIG. 5B, the resin layer 23 is exposed with a photomask 24. At this time, the photomask 24 employed has a predetermined optical transparency distribution, like in a gray-tone mask. More specifically, the photomask 24 has high optical transparency near the center of a circular pattern, and the optical transparency decreases on progression toward peripheral portions. Thus, in the resin layer 23, the degree of exposure is high near the center of the circular pattern, and the degree of exposure decreases on progression toward the peripheral portions.

Figure 5C:
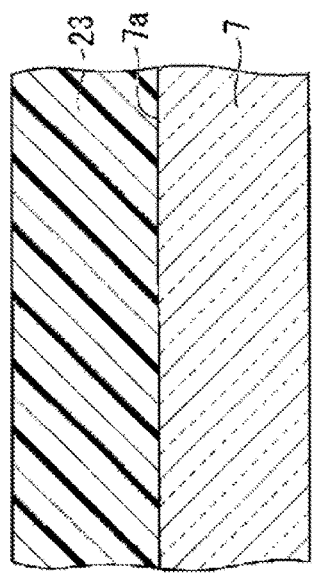

Next, as illustrated in FIG. 5C, the resin layer 23 is developed using a predetermined developer. In accordance with the differences in the degree of exposure of the resin layer 23, the amount of film reduction of the resin layer 23 at this time is high near the center of a circular pattern, and decreases on progression toward the peripheral portions. A recessed portion 9 having a parabolic line shaped cross-section profile is accordingly formed in the resin layer 23, so as to form the foundation layer 8. The shape of the parabolic line can be controlled via the optical transparency distribution of the photomask 24 used during exposure and the degree of exposure.

Figure 5D:
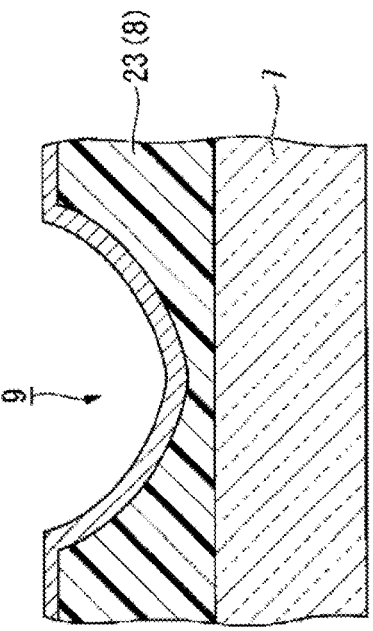

Next, as illustrated in FIG. 5D, a metal such as aluminum is deposited on the entire surface of the foundation layer 8, and the reflective layer 3 is formed.

Next, three methods can be given as examples of methods for forming the filling layer 12.

A description follows regarding these methods for forming the filling layer 12.

A first method for forming the filling layer is as follows.

First, as illustrated in FIG. 6A, a resin film 25, such as acrylic, epoxy, or polyimide, is formed on the entire surface of the reflective layer 3. The method of forming, the resin film 25 is, for example, coating a liquid-state resin material onto the reflective layer 3 using a method such as spin-coating or bar coating. At this time, the film thickness of the resin film 25 is set such that the resin film 25 fills the recessed portion 9, and also covers planar portions of the reflective layer 3.

Next, as illustrated in FIG. 6B, the entire surface of the resin film 25 is etched back using, for example, a method such as plasma ashing (dry ashing). At this time, the etch-back amount is adjusted such that an upper face 25a of the resin film 25 is in a position lower than the plane Q including the planar face 3a of the reflective layer 3. The filling layer 12 is thereby formed.

Next, as illustrated in FIG. 6C, the first electrode 4, the insulating layer 10 having the opening at a position overlapping with the recessed portion 9, the organic layer 5, and the second electrode 6 are formed in sequence on the planar face 3a of the reflective layer 3 and the upper face 12a of the filling layer 12. The first electrode 4, the insulating layer 10, the organic layer 5, and the second electrode 6 are formed by a known process. For example, a pattern may be formed by vacuum deposition using a shadow mask. There is no limitation thereto; a spray method, an inkjet method, a printing method, or a laser transfer method may be employed.

A second method for forming the filling layer is as follows.

Figure 7A:
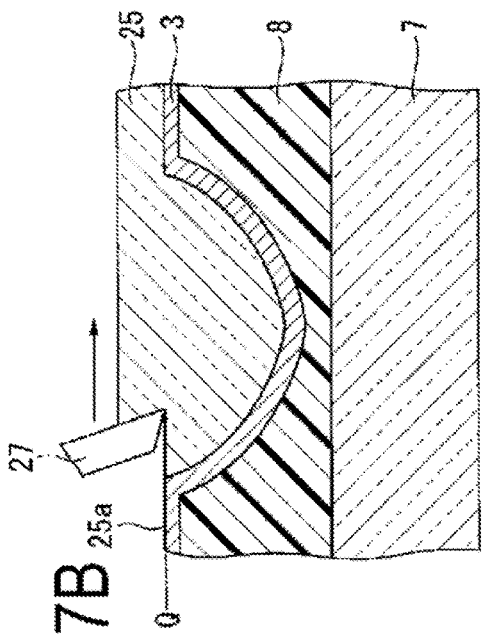
FIGS. 7A to 7D are cross-section views illustrating a second example of the production process continuing from the production process of FIGS. 5A to 5D.

As illustrated in FIG. 7A, the resin film 25, such as acrylic, epoxy, or polyimide, is formed on the entire surface of the reflective layer 3. This process is the same as that of the first method for forming the filling layer illustrated in FIG. 6A.

Figure 7B:
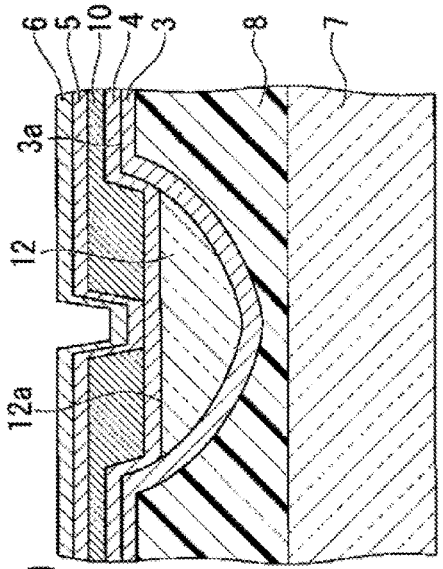

Next, as illustrated in FIG. 7B, the entire surface of the resin film 25 is leveled using a squeegee 27. At this time, the squeegee 27 is moved along the planar face 3a of the reflective layer 3 so that after the squeegee 27 has passed by, the upper face 25a of the resin film 25 is in the same plane as the plane Q including the planar face 3a of the reflective layer 3.

Figure 7C:
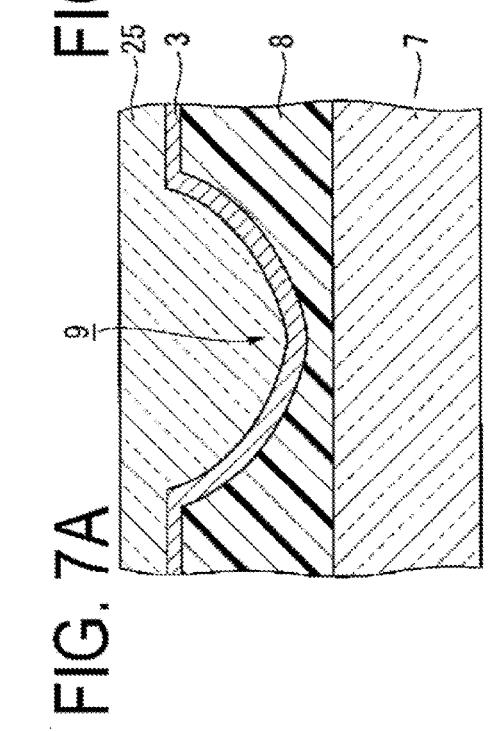

Next, as illustrated in FIG. 7C, the base material is baked with the resin film 25 remaining in the recessed portion 9. The volume of the resin film 25 shrinks due to baking, resulting in the upper face 25a of the resin film 25 being positioned lower than the plane Q including the planar face 3a of the reflective layer 3. The filling layer 12 is thereby formed.

Figure 7D:
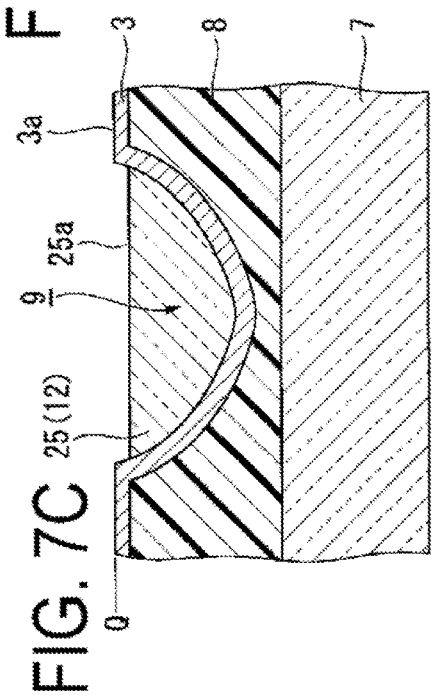

Next, as illustrated in FIG. 7D, the first electrode 4, the insulating layer 10, the organic layer 5, and the second electrode 6 are sequentially formed on the planar face 3a of the reflective layer 3 and the upper face 12a of the filling layer 12. This process is the same as that of the first method for forming the filling layer illustrated in FIG. 6C.

A third method for forming the filling layer is as follows.

Figure 8A:
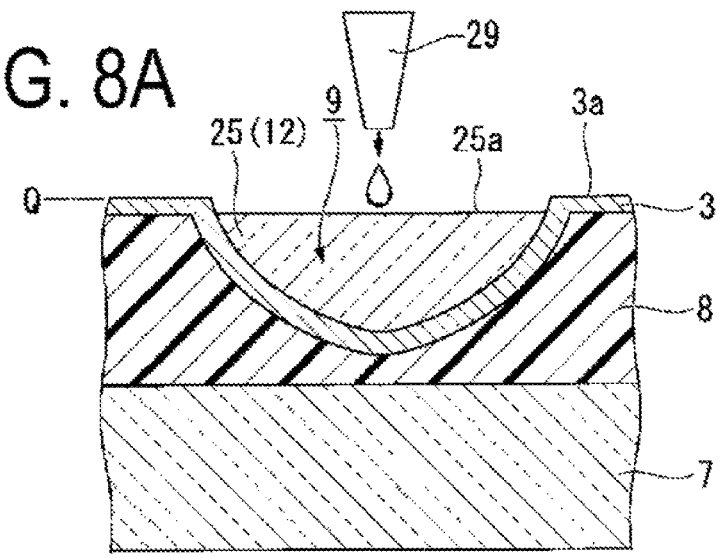
FIGS. 8A and 8B are cross-section views illustrating a third example of the production process continuing from the production process of FIGS. 5A to 5D.

As illustrated in FIG. 8A, the resin film 25, such as acrylic, epoxy, or polyimide, is layered onto the surface of the reflective layer 3 at the inside of the recessed portion 9. As the method for forming the resin film 25, for example, a resin material is applied onto the reflective layer 3 in a liquid drop state using a method such as ink jetting. At this time, the amount of resin material ejected from an inkjet head 29 is adjusted such that the upper face 25a of the resin film 25 is positioned lower than the plane Q including the planar face 3a of the reflective layer 3. The filling layer 12 is thereby formed.

Figure 8B:
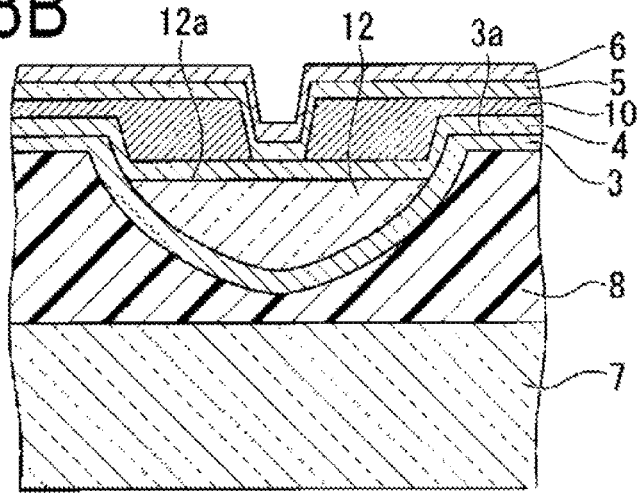

Next, as illustrated in FIG. 8B, the first electrode 4, the insulating layer 10, the organic layer 5, and the second electrode 6 are sequentially formed on the planar face 3a of the reflective layer 3 and the upper face 12a of the filling layer 12. This process is the same as that of the first method for forming the filling layer illustrated in FIG. 6C.

The organic EL device 1 of the present embodiment is completed by the process above.

A description follows regarding operation and advantageous effects of the organic EL device of the present embodiment.

Figure 9A:
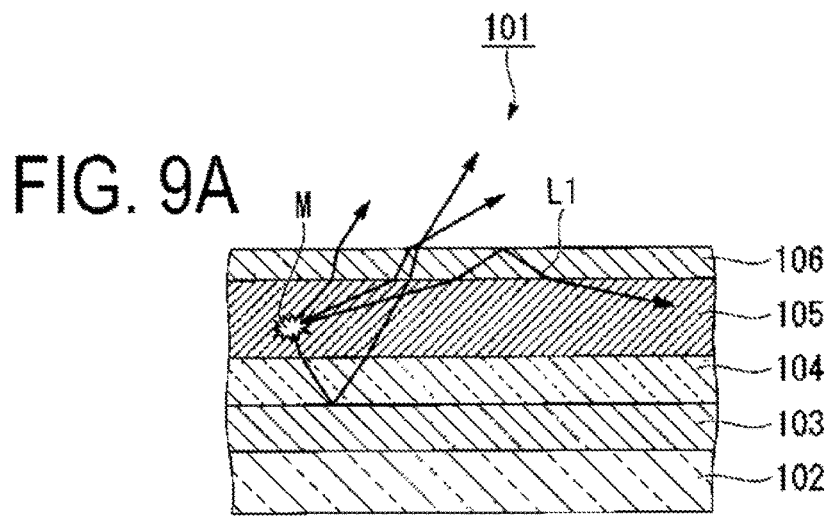
FIG. 9A is a cross-section view for explaining problems with conventional organic EL devices and FIG. 9B is a cross-section view for explaining operation of an organic EL device of an embodiment.

FIG. 9A is a cross-section view illustrating a conventional organic EL device 101.

The organic EL device 101 has a configuration in which a reflective layer 103, a first electrode 104, an organic layer 105, and a second electrode 106 are sequentially layered onto a substrate 102. In the organic EL device 101, light emitted by the light-emitting layer in the organic layer 105 is emitted uniformly in all directions, and advances through the interior while being refracted by the interfaces between respective layers having different refractive indexes. Light that has advanced toward the substrate 102 side is reflected by the reflective layer 103.

Since there is a difference in refractive index at the interface between the second electrode 106 and the external space (air), light incident on this interface at a small angle of incidence is emitted to the external space, and light incident at a large angle of incidence is reflected by this interface and advances though the interior again. For example, light L1 emitted from a random light-emission point P inside the organic layer 105 in a direction close to a horizontal direction is not easily emitted to the external space even when the angle has been somewhat changed by refraction by the inter-layer interface.

Loss due to reflection of light at the interface between the second electrode 106 and the external space (air) does not occur on the path of light advancing through the interior of the organic EL device 101. In contrast thereto, since the reflectivity of metals configuring the reflective layer 103 is generally not 100%, loss does occur on reflection of light at the interface between the first electrode 104 and the reflective layer 103. Moreover, some of the light is absorbed into respective layers while advancing through the interior of the organic EL device 101. Accordingly, the light is attenuated while propagating through the interior of the organic EL device 101. Ordinarily, the refractive index of the organic layer 105 is approximately 1.8. In such cases, of the light emitted from the light-emitting layer, the proportion of light extracted to the external space is approximately 20%.

Thus, the conventional organic EL device 101 has the problem of low light utilization efficiency.

Figure 9B:
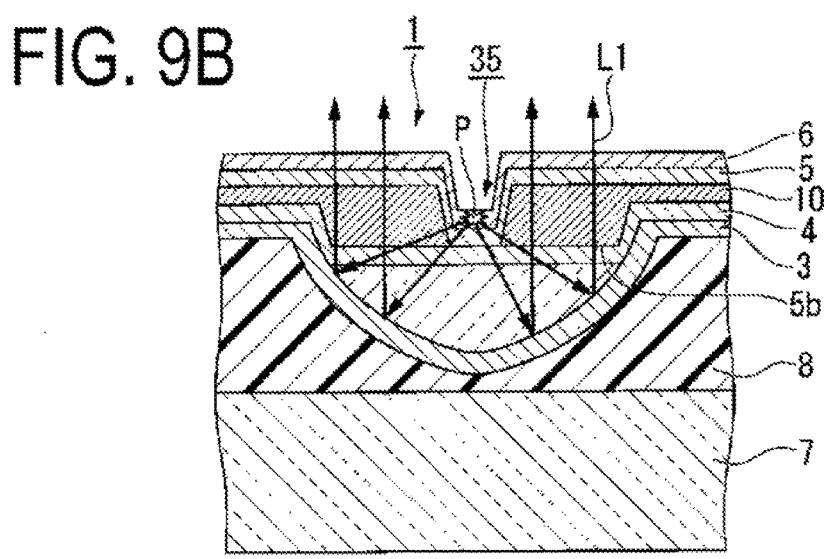

In contrast thereto, in the organic EL device 1 of the present embodiment, as illustrated in FIG. 9B, the advance direction of light reflected by the reflective layer 3 changes because the reflective layer 3 is curved along the recessed portion 9, and the light advances through the interior of the organic EL device 1. At this time, due to having been reflected by the reflective layer 3, light having a large angle of incidence with respect to the interface between the second electrode 6 and the external space (air) is changed to a smaller angle of incidence than a critical angle at the interface between the second electrode 6 and the external space, and is extracted to the external space.

More specifically, in the case of the present embodiment, the reflective layer 3 is formed along the inner face of the recessed portion 9, which has the shape of a parabola, and thus the surface of the reflective layer 3 also has a parabola shape. Moreover, as described above, the upper face 12a of the filling layer 12 is in a position lower than the plane Q including the planar face 3a of the reflective layer 3, and a lower face 5b of the organic layer 5 is also in a position lower than the plane Q. Accordingly, the reflective layer 3 is present at either side of the light-emitting region 35 (in the left-right direction in FIG. 10). Therefore, for example, light L1 emitted from a random light-emission point P inside the organic layer 5 in a direction close to a horizontal direction is reflected by the reflective layer 3 and the angle of the advance direction is changed.

Figure 10:
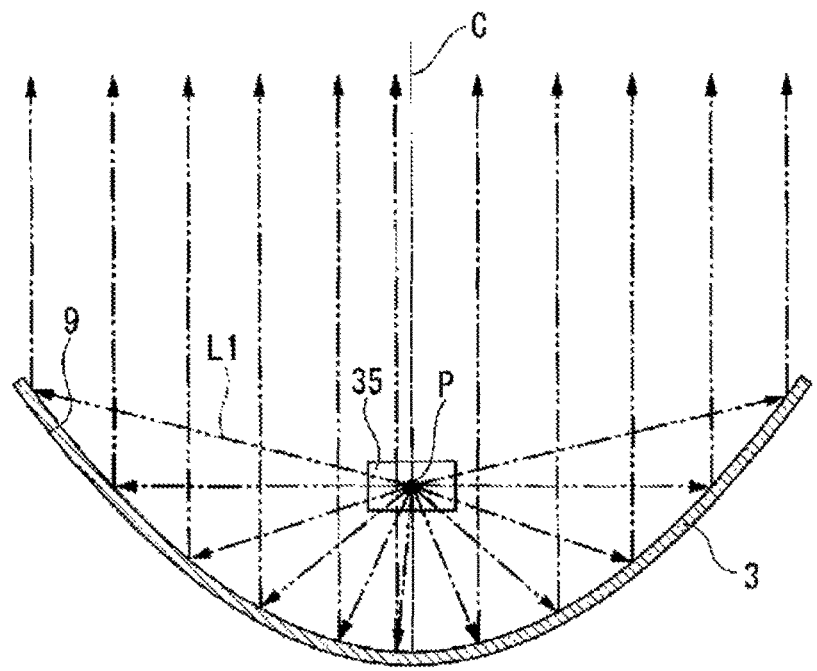
FIG. 10 is a diagram for explaining an advantageous effect of a shape of a recessed portion.

As illustrated in FIG. 10, light L1 in the light-emitting region 35 emitted from a light-emission point P positioned at the focal point of the parabolic line, which is the cross-section profile of the recessed portion 9, advances in a direction parallel to the central axis C of the parabolic line, namely, a direction orthogonal to the interface between the organic EL device 1 and the external space, after the light has been reflected by the reflective layer 3. Although light L1 is emitted in all directions from the light-emission point P. regardless of the direction in which the light L1 has been emitted, the light L1 advances in a direction parallel to the central axis C of the parabolic line after reflection by the reflective layer 3.

When expressed as a quadratic function in xy coordinates, parabolic lines take the general form $y=Ax^2$, and the position coordinates of the focal point of the parabolic line are then $(0, 1/(4A))$. It is sufficient to set the position of the light-emitting region 35 and the shape of the recessed portion such that the focal point is positioned in the interior of the light-emitting region 35.

Moreover, when considering light emitted from a light-emission point offset from the focal point of the parabolic line, the positional offset from the focal point of the parabolic line is small for every light-emission point in the light-emitting region 35 because the light-emitting region 35 is restricted to a sufficiently narrow region by the insulating layer 10. Accordingly, even for light emitted from a light-emission point separated from the focal point of the parabolic line, after having been reflected by the reflective layer 3, the light advances in a direction substantially parallel to the central axis C of the parabolic line, namely, a direction substantially orthogonal to the interface between the organic EL device 1 and the external space. Whatever the case, after having been reflected by the reflective layer 3, light L emitted from the light-emitting region 35 is incident at a sufficiently small angle of incidence with respect to the interface between the organic EL device 1 and the external space, enabling much of the light L to be extracted to the external space. The light utilization efficiency can thereby be increased.

Note that in the present embodiment, even light emitted in the substantially horizontal direction from the light-emission point P in the organic layer 5 can be incident on the reflective layer 3 because the upper face 12a of the filling layer 12 is in a position lower than the plane Q and the lower face 5b of the organic layer 5 is also in a position lower than the plane Q. However, if the upper face 12a of the filling layer 12 were in-plane with the plane Q, the lower face 5b of the organic layer 5 would be positioned higher than the plane Q. In such cases, light emitted in the substantially horizontal direction from the light-emission point P in the organic layer 5 would not be incident on the reflective layer 3 because the reflective layer 3 would not be present at the side of the organic layer 5 positioned inside the recessed portion 9. However, even in such cases, the proportion of light that is emitted from the light-emission point P inside the organic layer 5 within a predetermined angle range close to the horizontal direction and that is incident on the reflective layer 3 is sufficiently increased compared to the conventional organic EL device 101. Accordingly, light utilization efficiency can be raised even when such a configuration is employed.

To verify the advantageous effects of the organic EL device 1 of the present embodiment, the present inventors produced a bottom-emitting organic EL device (a conventional example) and an organic EL device of the present embodiment (Example 1), and compared their optical characteristics. Luminous current efficiency (cd/A) was adapted as an evaluation item. To analyze phenomena in an easily understood manner, measurements in a front direction were employed for the evaluation item. Both produced samples were green light-emitting elements.

The measurements are listed in Table 2.

TABLE 2

|  | Conventional Example | Example 1 |
|---|---|---|
| Luminous current efficiency (cd/A) | 1 | 3.0 |

As shown in Table 2, it was apparent that the luminous current efficiency of Example 1 was 3.0 times the luminous current efficiency of the conventional example. It was thereby verified that an organic EL device having high brightness at low power consumption can be realized.

Note that although description has been given regarding the example of a green light-emitting element in the present embodiment, a red light-emitting element, a blue light-emitting element, or a light-emitting element of another color can exhibit the same advantageous effects. The advantageous effects are not limited to any specific luminescence color. Moreover, although specific numeric values were given for the green light-emitting element in the verification results, similar results were obtained for red light-emitting elements and blue light-emitting elements.

Second Embodiment

A description follows regarding a second embodiment of the present invention, with reference to FIG. 11 to FIG. 14.

The basic configuration of the organic EL device of the second embodiment is the same as that of the first embodiment, but differs from the first embodiment in that second recessed portions are provided.

Figure 11:
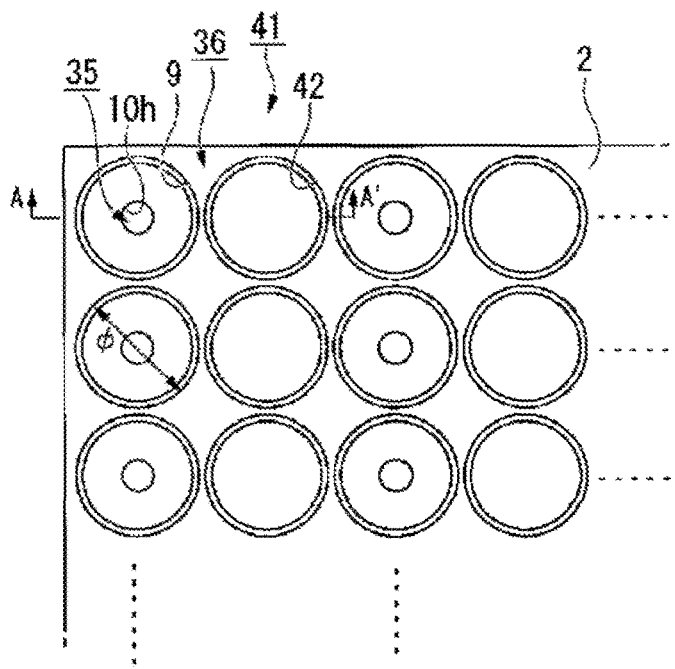
FIG. 11 is a plan view of an organic EL device of a second embodiment.

FIG. 11 is a plan view of an organic EL device of the second embodiment.

In FIG. 11 to FIG. 14, the same reference signs are allocated to components common to the figures employed in the first embodiment, and detailed description thereof is omitted.

In an organic EL device 41 of the present embodiment, as illustrated in FIG. 11, second recessed portions 42 are provided in a non-light-emitting region 36. Viewed in a direction normal to the upper face of the base material 2, the planar shape of each second recessed portion 42 is a circle. The diameter of the second recessed portion 42 is not particularly limited to a specific value, and may be approximately equivalent to that of the first recessed portion 9 in the present embodiment. Each of the second recessed portions 42 is provided between two first recessed portions 9 adjacent in the horizontal direction in FIG. 11. The plurality of first recessed portions 9 are provided in a row in the vertical direction, and the plurality of second recessed portions 42 are also provided in a row in the vertical direction. Rows formed of the plurality of first recessed portions 9 and rows formed of the plurality of second recessed portions 42 are provided alternately along the horizontal direction. Although one second recessed portion 42 is provided between adjacent first recessed portions 9 in FIG. 11, two or more second recessed portions 42 may be provided between adjacent first recessed portions 9.

Note that although the first recessed portions 9 are the same as the recessed portions 9 of the first embodiment, the recessed portions that are the same as the recessed portions 9 of the first embodiment are referred to as the first recessed portions 9 in order to distinguish them from the second recessed portions 42 of the present embodiment.

Figure 12:
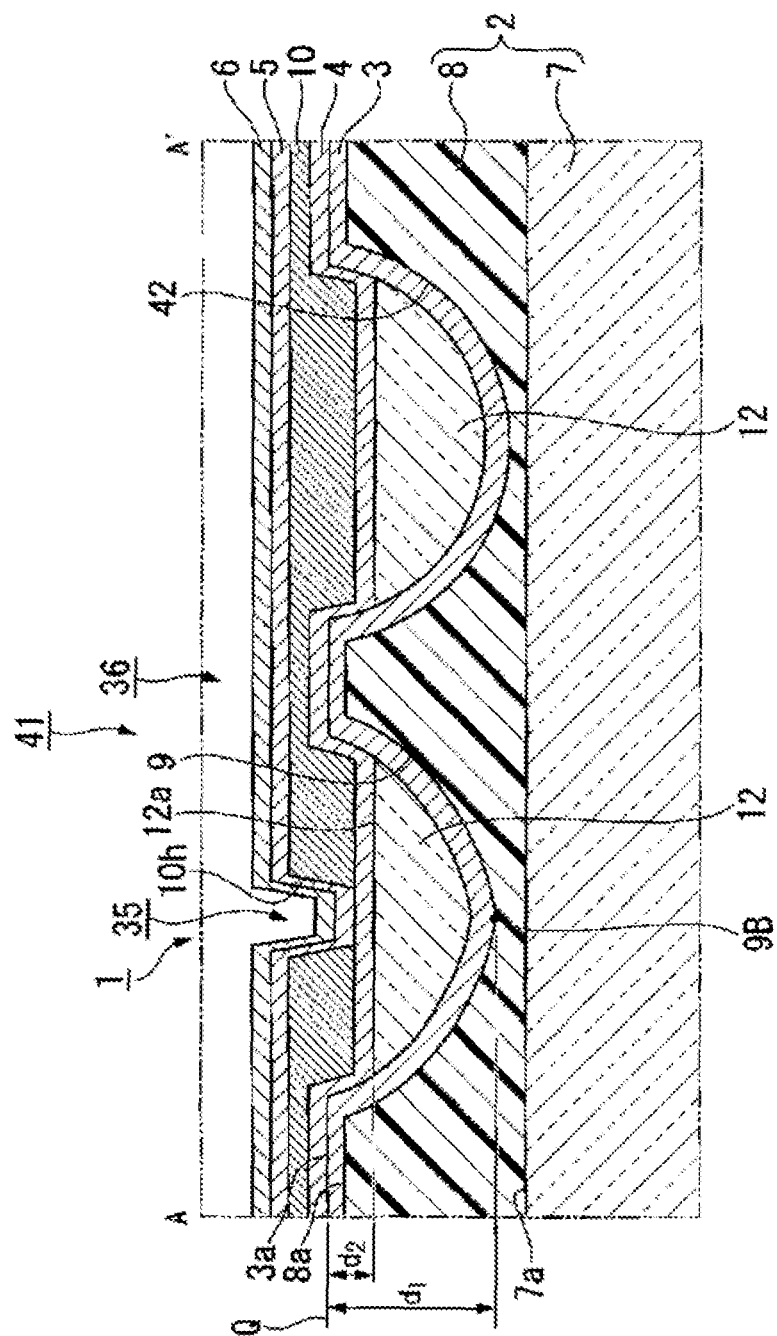
FIG. 12 is a cross-section view taken along line A-A' in FIG. 11.

FIG. 12 is a cross-section view of the organic EL device 41 sectioned along a plane orthogonal to the upper face of the base material 2 and a cross-section view taken along line A-A' in FIG. 11.

The first recessed portions 9 and the second recessed portions 42 are provided in the upper face 8a of the foundation layer 8 with their openings facing upward. Although the insulating layer 10 includes the openings 10h above the first recessed portions 9, the insulating layer 10 does not include openings above the second recessed portions 42. Each second recessed portion 42 is therefore a non-light-emitting region. Other than the presence or absence of the opening 10h, the first recessed portion 9 and the second recessed portion 42 are identical recessed portions. The cross-section profile of the second recessed portion 42 may be a similar parabola shape to that of the first recessed portion 9, but need not necessarily be parabola shaped. The cross-section profile of the second recessed portion 42 may, for example, be a circular arc, or may be a curved line shape with no focal point. Moreover, the cross-section profile of the second recessed portion 42 may be an undulating shape having a mixture of a plurality of recessed portions and a plurality of bulging portions. In the present embodiment, the cross-section profile of the second recessed portion 42 is a circular arc.

In the organic EL device 41 of the present embodiment, a direction of the path of light that has been reflected by the reflective layer 3 can be turned to a direction substantially orthogonal to the interface between the organic EL device 41 and the external space, because the parabola shaped first recessed portions 9 are provided and the light-emitting regions 35 are provided at the focal point positions of the recessed portion shapes. As a result, the same advantageous effects can be obtained as in the first embodiment; namely, an organic EL device having high brightness at low power consumption can be realized.

The following operation and advantageous effects can also be obtained in the organic EL device 41 of the present embodiment.

Figure 13:
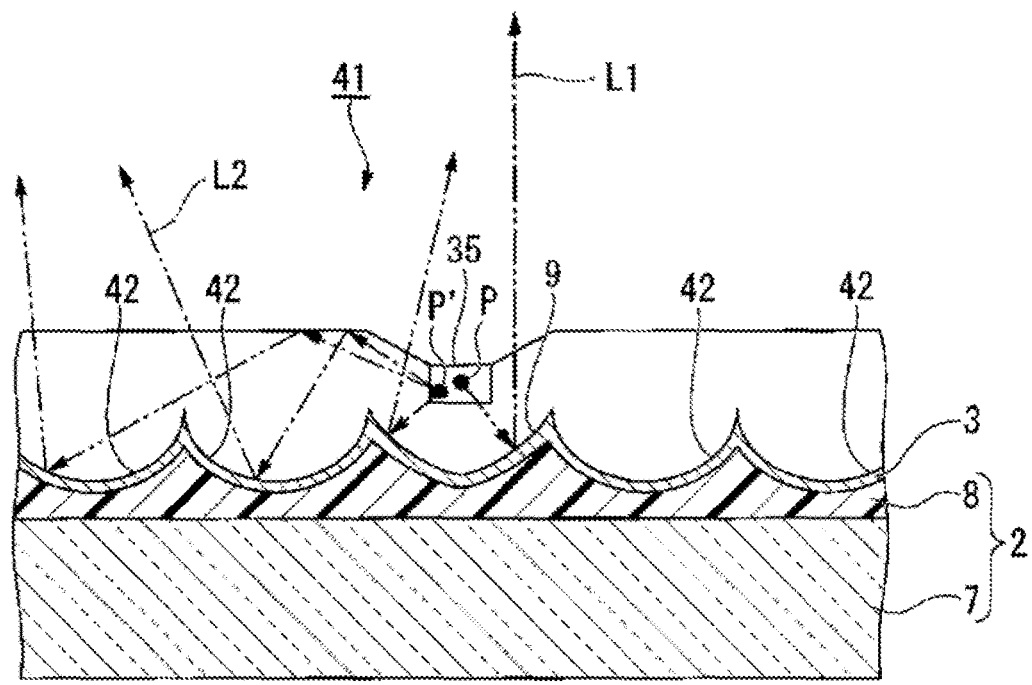
FIG. 13 is a cross-section view for explaining operation of an organic EL device of an embodiment.

From the viewpoint of reducing loss and absorption, light emitted from the light-emitting region 35 is preferably extracted to the exterior as soon as possible. However, not all of the light is extracted at an early point in time; there is also light that propagates in the horizontal direction through the interior of the organic EL device 41 without being extracted to the exterior. In contrast thereto, as illustrated in FIG. 13, when light L2 that propagates in the horizontal direction is incident on the second recessed portion 42, the light is reflected by the reflective layer 3 of the second recessed portion 42 such that the advance direction of the light is changed, and some of the light is extracted to the external space, because the organic EL device 41 of the present embodiment is provided with the second recessed portion 42 horizontal to the first recessed portions 9. Note that in FIG. 13, an example is illustrated in which two second recessed portions 42 are provided horizontal to the first recessed portion 9 in order to illustrate the operation and advantageous effects of the present embodiment clearly.

Thus, in the organic EL device 41 of the present embodiment, light L2 that is propagating in the horizontal direction and has not been extracted by the first recessed portions 9 can be extracted by the second recessed portions 42. As a result, light extraction efficiency can be increased further. However, the amount of attenuation of light becomes exceedingly great when the propagation distance of light in the horizontal direction is long. Accordingly, the second recessed portion 42 is preferably provided in a region that is within 100 μm of the light-emitting region 35.

To verify the advantageous effects of the organic EL device 41 of the present embodiment, the present inventors produced an organic EL device of the present embodiment (Example 2) and measured the optical characteristics. More specifically, the brightness was measured at a plurality of measurement points having different distances from the light-emitting region 35. In example 2, a sample was used in which second recessed portions 42 having similar shape and structure to the first recessed portion 9 were formed consecutively adjacent to the first recessed portions 9.

Figure 14:
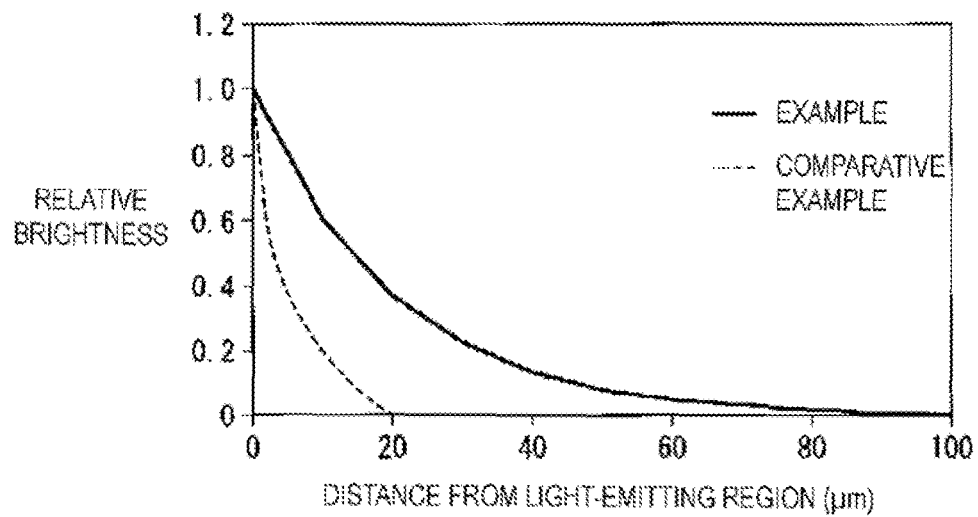
FIG. 14 is a graph showing an advantageous effect of an organic EL device of an embodiment.

FIG. 14 illustrates measurements for the organic EL device of Example 2. The horizontal axis of FIG. 14 is distance (μm) from the light-emitting region, and the vertical axis of FIG. 14 is the relative brightness when the brightness above the light-emitting region is taken as 1. The solid line of the graph represents the results for Example 2, and the dashed line of the graph represents the results for a comparative example.

As shown in FIG. 14. in the organic EL device of the comparative example, which is not provided with the second recessed portions, the brightness drops sharply as the distance from the light-emitting region increases, and the light has virtually zero brightness in regions separated from the light-emitting region, more specifically, in regions at a distance of 20 μm or greater from the light-emitting region. In contrast thereto, in the organic EL device of the Example 2, the degree of decline in the brightness is gentle compared to the comparative example, the relative brightness was approximately 0.35 when the distance from the light-emitting region was 20 μm, and the relative brightness was approximately 0.15 when the distance from the light-emitting region was 40 μm.

Thus, according to the organic EL device 41 of the present embodiment, it has been verified that light extraction efficiency can be improved especially at positions separated from the light-emitting region.

Third Embodiment

Figure 15:
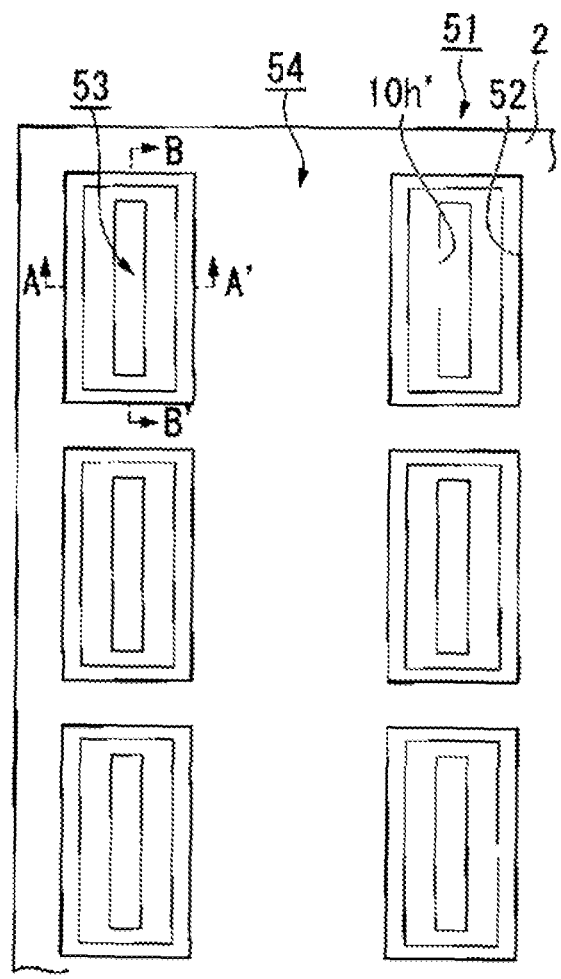
FIG. 15 is a plan view of an organic EL device of a third embodiment.
Figure 16:
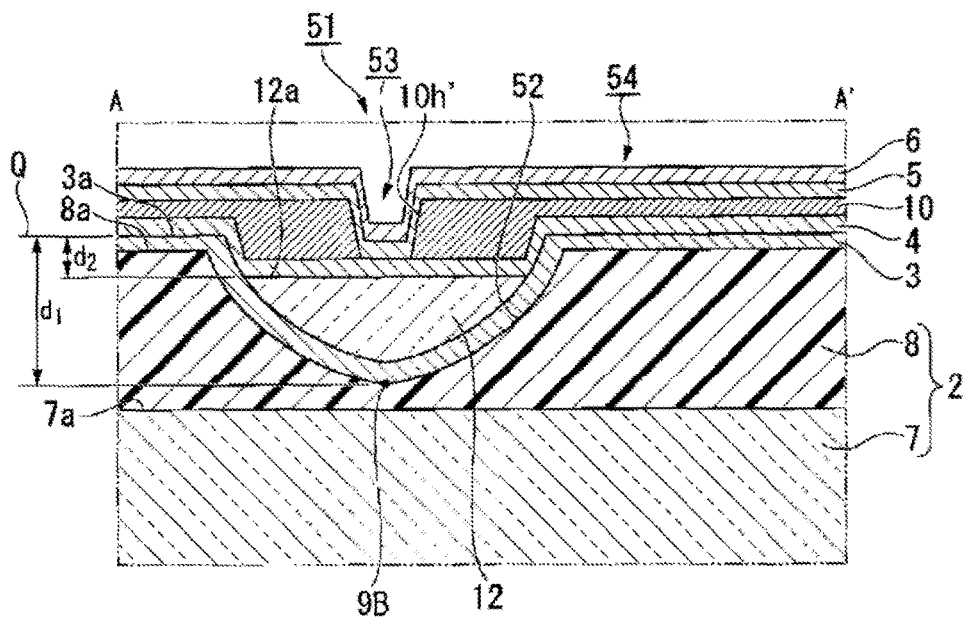
FIG. 16 is a cross-section view taken along line A-A' in FIG. 15.
Figure 17:
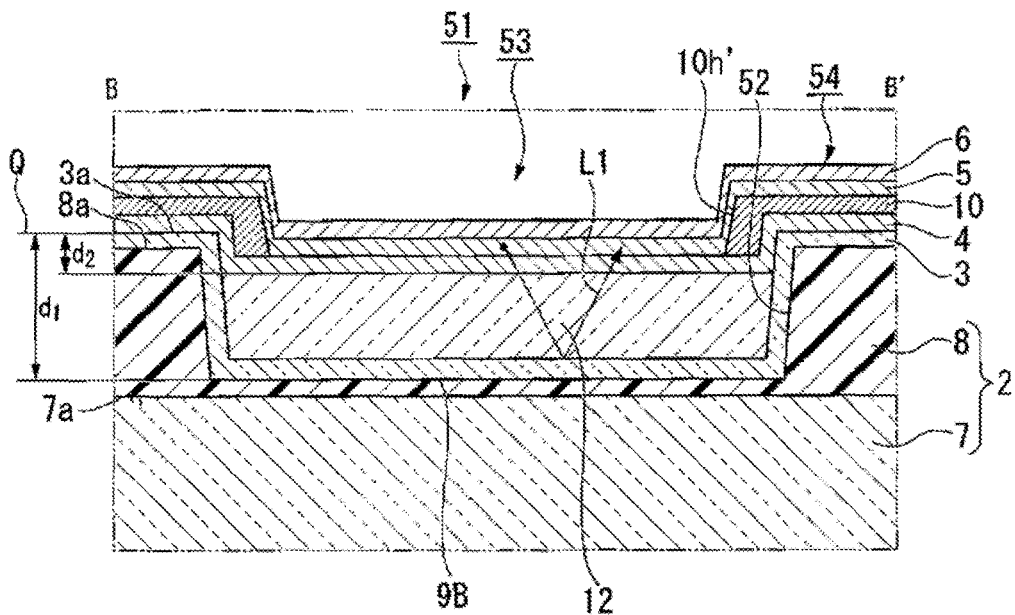
FIG. 17 is a cross-section view taken along line B-B' in FIG. 15.

A description follows regarding a third embodiment of the present invention, with reference to FIG. 15 to FIG. 17.

The basic configuration of the organic EL device of the third embodiment is the same as that of the first embodiment, except that the shape of the first recessed portion is different from that of the first embodiment.

FIG. 15 is a plan view of an organic EL device of the third embodiment.

In FIG. 15 to FIG. 17, components common to the figures employed in the first embodiment are allocated the same reference sign, and detailed description thereof is omitted.

In the first embodiment, the planar shape of the recessed portion is a circle. In contrast thereto, as illustrated in FIG. 15, an organic EL device 51 of the present embodiment is provided with a plurality of recessed portions 52, and the planar shape of each recessed portion 52 is a rectangle. The plurality of recessed portions 52 are regularly disposed in vertical and horizontal directions. The plurality of recessed portions 52 are disposed close to one another in the longitudinal direction of the rectangle, but are separated a predetermined distance from one another in the width direction. Moreover, an opening 10h' in the insulating layer are provided at a position overlapping with each of the recessed portions 52. The planar shape of each opening 10h' is a rectangle. The entire edge of the opening 10h' is positioned at the inside of the entire edge of the recessed portion 52. The inside of the opening 10h' is a light-emitting region 53 and the outside of the opening 10h' is a non-light-emitting region 54.

The recessed portion 52 of the present embodiment corresponds to the first recessed portion in the scope of the claims.

FIG. 16 and FIG. 17 are cross-section views of the organic EL device 51 sectioned along a plane orthogonal to the upper face of the base material 2. FIG. 16 is a cross-section view taken along line A-A' of FIG. 15, and FIG. 17 is a cross-section view taken along line B-B' of FIG. 15.

As illustrated in FIG. 16, the cross-section profile along the width direction of the recessed portion 52 is a similar parabolic line shape (a parabola shape) to that of the first embodiment. The position of the focal point of the parabolic line is in the interior of the light-emitting region 53. However, as illustrated in FIG. 17, the cross-section profile along the longitudinal direction of the recessed portion 52 is trapezoidal. The base of the recessed portion 52 is a straight line shape having no curvature. Accordingly, the cross-section profile along the longitudinal direction of the recessed portion 52 has no focal point. Namely, the recessed portion 52 has a cylindrical shape with three-dimensional anisotropy. The configuration is otherwise the same as in the first embodiment. The cross-section profile along the longitudinal direction of the recessed portion 52 is not limited to a trapezoid, and may be another freely-selected shape.

In the case of the organic EL device 51 of the present embodiment, as illustrated in FIG. 16, the cross-section profile of the recessed portion 52 in the horizontal direction of the recessed portion 52 (the width direction in FIG. 15) is a similar parabolic line shape (parabola shape) to that in the first embodiment. The focal point of the parabolic line is positioned in the interior of the light-emitting region 53. Thus, as described with reference to FIG. 10 in the first embodiment, after having been reflected by the reflective layer 3, light emitted from the light-emission point P positioned at the focal point of the parabolic line advances in a direction parallel to the central axis C of the parabolic line, namely, in a direction substantially orthogonal to the interface between the organic EL device 51 and the external space. As a result, the angle of incidence of the light with respect to the interface between the organic EL device 51 and the external space is made sufficiently small, and much of the light can be extracted. However, as illustrated in FIG. 17, for the longitudinal direction of the recessed portion 52 (vertical direction), the base lace of the recessed portion 52 is planar, the light L1 is mirror reflected by the reflective layer 3, and there is no action that reduces the angle of incidence of the light. Even so, when the organic EL device 51 overall is considered, the light utilization efficiency is increased compared to a conventional organic EL device due to the effect of making the recessed portion 52 parabola shaped in one direction.

To verify the advantageous effects of the organic EL device 51 of the present embodiment, the present inventors produced a bottom-emitting organic EL device (a conventional example) and the organic EL device of the present embodiment (Example 3), and compared their optical characteristics. The luminous current efficiency (cd/A) was adapted as an evaluation item. To analyze the phenomenon in an easily understood manner, measurements in a front direction were employed for the evaluation item. Both produced samples were green light-emitting elements.

The measurements are listed in Table 3.

TABLE 3

|  | Conventional Example | Example 3 |
|---|---|---|
| Luminous current efficiency (cd/A) | 1 | 2.0 |

As shown in Table 3, it was apparent that the luminous current efficiency of Example 3 was inferior to that of Example 1, but was 2.0 times the luminous current efficiency of the conventional example. It was thus verified that, even though the cross-section profile of the recessed portion 52 only has a parabolic line shape in one specific direction rather than in all directions, an organic EL device having high brightness at lower power consumption compared to a conventional organic EL device can be realized.

Note that although description has been given in the present embodiment regarding an example of a green light-emitting element, a red light-emitting element, a blue light-emitting element, or the like, or a light-emitting element of another color, can also exhibit the same advantageous effects. The advantageous effects are not limited to any specific luminescence color. Moreover, although specific numeric values were given for the green light-emitting element in the verification results, similar results were obtained for red light-emitting elements and blue light-emitting elements.

Fourth Embodiment

Figure 18:
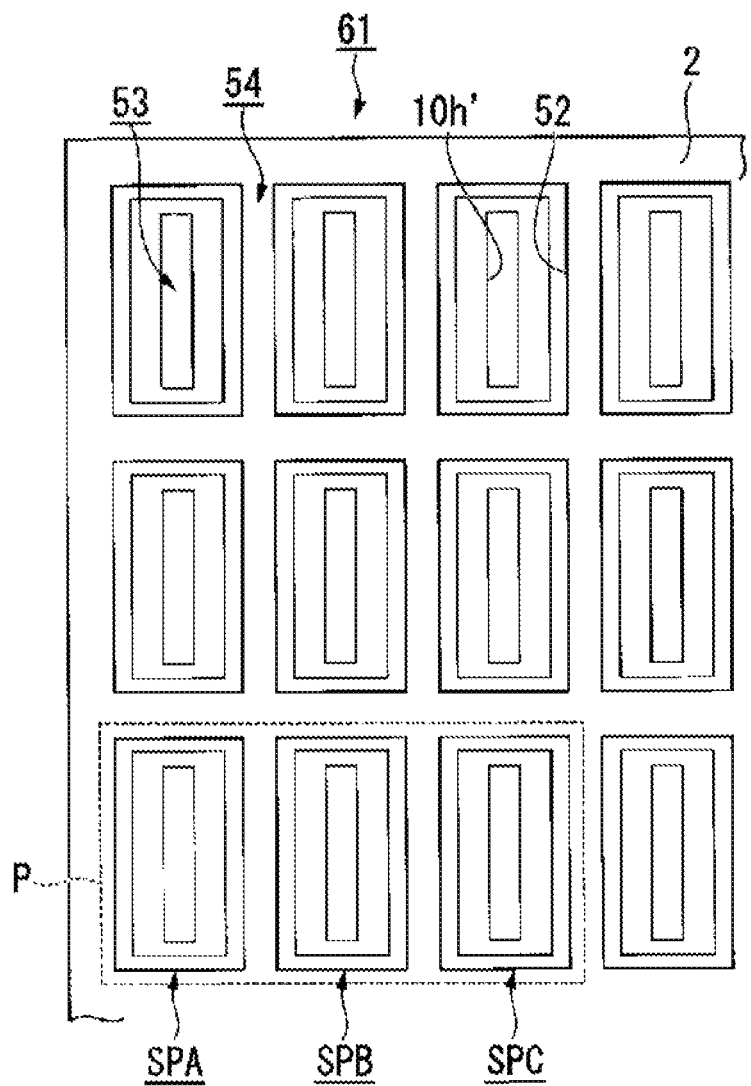
FIG. 18 is a plan view illustrating an organic EL device of a fourth embodiment.

A description follows regarding a fourth embodiment of the present invention, with reference to FIG. 18.

In the fourth embodiment, an example is given in which an organic EL device of one aspect of the present invention is applied to a display device provided with a plurality of pixels disposed in, for example, a matrix arrangement.

The basic configuration of the organic EL device is the same as that of the third embodiment.

FIG. 18 is a plan view of an organic EL device of the fourth embodiment.

In FIG. 18, components common to FIG. 15 employed in the third embodiment are allocated the same reference signs, and detailed description thereof is omitted.

As illustrated in FIG. 18, an organic EL device 61 of the present embodiment is provided with a plurality of pixels P disposed in a matrix arrangement. One pixel P is configured by three subpixels: a first subpixel SPA, a second subpixel SPB, and a third subpixel SPC. The first subpixel SPA, the second subpixel SPB, and the third subpixel SPC each have a rectangular shape. The first subpixel SPA emits red light. The second subpixel SPB emits green light. The third subpixel SPC emits blue light. The subpixels SPA, SPB, and SPC each include one recessed portion 52 that is the same as that of the third embodiment.

The first subpixel SPA, the second subpixel SPB, and the third subpixel SPC collectively correspond to a unit display region of the scope of the claims.

The first subpixel SPA, the second subpixel SPB, and the third subpixel SPC each include the same recessed portion 52 as that of the third embodiment, which has the planar shape of a rectangle. Electric fields can be applied to the first subpixel SPA, the second subpixel SPB, and the third subpixel SPC independently (these subpixels can be driven independently). Although omitted from illustration in the drawings, in the present embodiment, for example, a plurality of data lines and a plurality of scanning lines are provided intersecting each other on the base material 2, and one subpixel, SPA, SPB, or SPC, is provided in regions surrounded by mutually adjacent data lines and mutually adjacent scanning lines. The first electrode 4 described in the first embodiment is separated from each other for each of the subpixels, and each individual first electrode 4 is connected to the data line and the scanning line via a switching element such as a thin film transistor (shortened to TFT hereafter). Namely, the organic EL device 61 of the present embodiment is an active matrix-type organic EL device. Although an active matrix employing TFTs is adapted as a configuration in which electric fields are independently applied to each of the subpixels SPA, SPB, and SPC here, there is no limitation to this type, and, for example, a type such as a simple matrix-type or a segmented driving-type may be adapted.

Similar to the first to third embodiments, the present embodiment enables the organic EL device 61 having excellent light utilization efficiency to be realized. In the case of the present embodiment in particular, an organic EL display having high brightness at low power consumption can be realized.

Although an example has been given in the present embodiment in which each subpixel SPA, SPB, and SPC includes one recessed portion 52, each subpixel SPA, SPB, and SPC may include a plurality of recessed portions 52. The planar shape of the recessed portion 52 need not necessarily be a rectangle, and may be a freely-selected shape.

Fifth Embodiment

Figure 19:
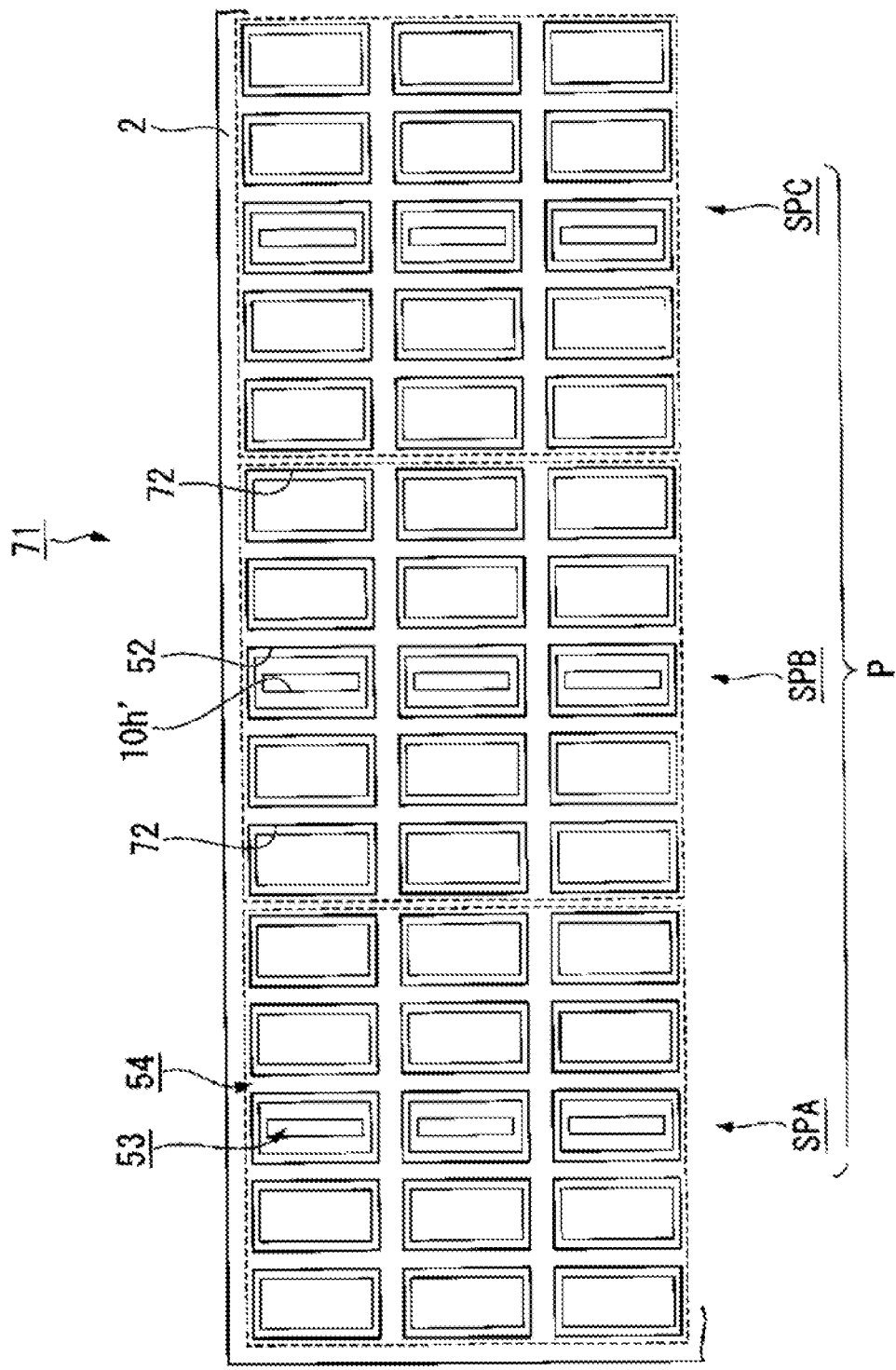
FIG. 19 is a plan view illustrating an organic EL device of a fifth embodiment.

A description follows regarding a fifth embodiment of the present invention, with reference to FIG. 19.

The basic configuration of the organic EL device of the fifth embodiment is the same as that of the fourth embodiment.

FIG. 19 is a plan view of an organic EL device of the fifth embodiment.

In FIG. 19, components common to that in FIG. 18 employed in the fourth embodiment are allocated the same reference signs, and detailed description thereof is omitted.

As illustrated in FIG. 19, in an organic EL device 71 of the present embodiment, two second recessed portions 72 that are provided in the non-light-emitting region 54 are provided on either side of the first recessed portion 52 including the light-emitting region 53. A first subpixel SPA is configured by three rows. Each of the rows includes these five recessed portions 52 and 72. The configuration of the second subpixel SPB and the third subpixel SPC is the same as that of the first subpixel SPA.

Since the regions where the second recessed portions 72 are provided are the non-light-emitting regions 54, direct light emitted by the second recessed portions 72 does not occur. However, as described with reference to FIG. 13 in the second embodiment, light propagating in the horizontal direction that is not extracted by the first recessed portion 52 is extracted from the second recessed portions 72. Thus, light is emitted from all of the recessed portions 52 and 72 in one subpixel as a result.

Similar to the first to the fourth embodiment, in the present embodiment also, the organic EL device 71 having excellent light utilization efficiency can be realized. In the case of the present embodiment in particular, an organic EL display having high brightness at low power consumption can be realized.

Although an example has been given in the present embodiment in which each subpixel SPA, SPB, or SPC includes three rows, and each of the rows includes one first recessed portion 52 and four second recessed portions 72, the number of recessed portions, or number of rows of recessed portions, included in each subpixel SPA, SPB, and SPC, may be appropriately modified. The planar shapes of the recessed portions 52 and 72 need not necessarily be rectangles, and may be freely-selected shapes.

Sixth Embodiment

Figure 20:
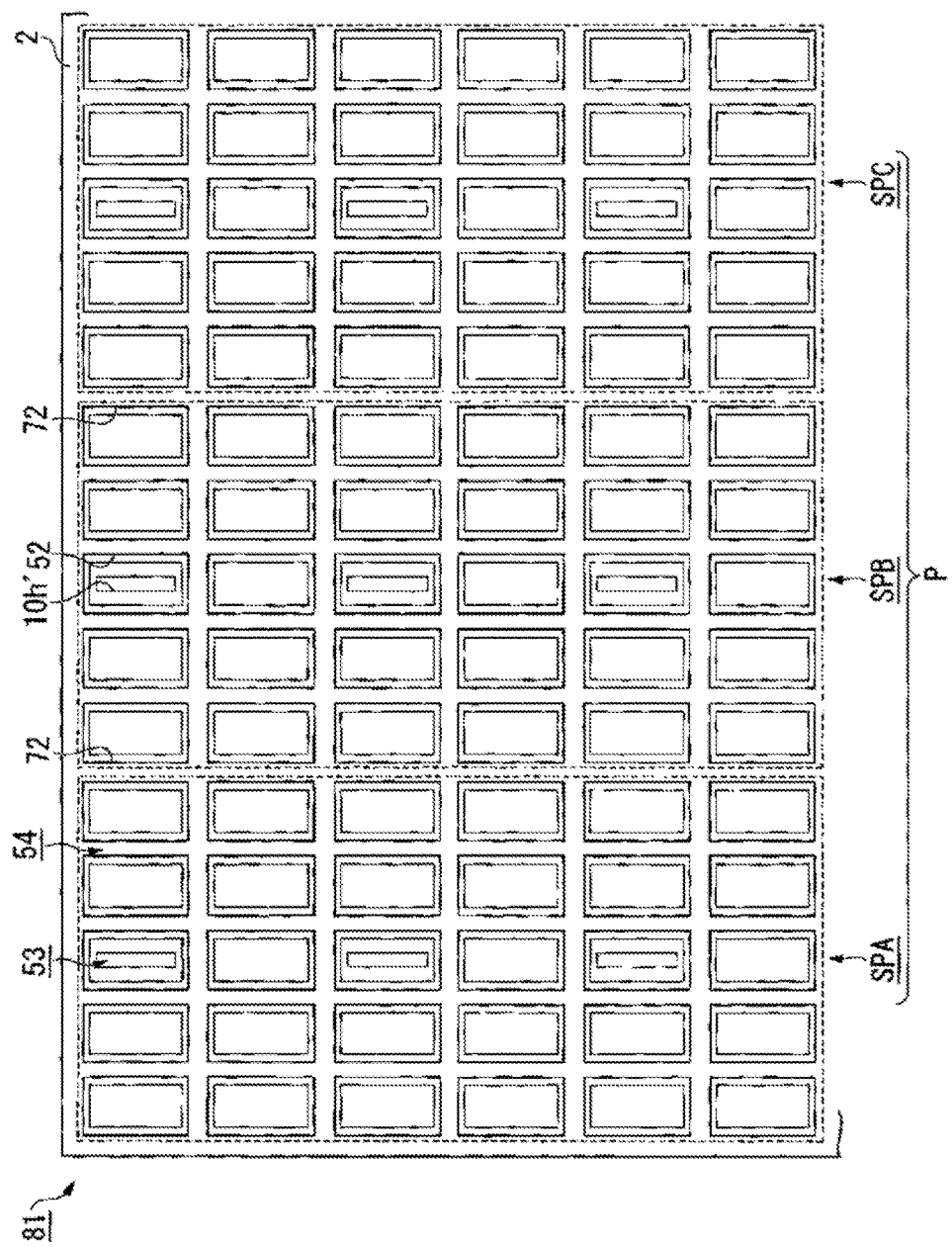
FIG. 20 is a plan view illustrating an organic EL device of a sixth embodiment.

A description follows regarding a sixth embodiment of the present invention, with reference to FIG. 20.

The basic configuration of an organic EL device of the sixth embodiment is the same as that of the fifth embodiment.

FIG. 20 is a plan view of the organic EL device of the sixth embodiment.

In FIG. 20, components common to that in FIG. 19 employed in the fifth embodiment are allocated the same reference signs, and detailed description thereof is omitted.

As illustrated in FIG. 20, rows provided with two second recessed portions 72 at either side of each first recessed portion 52, and rows provided with five of the second recessed portions 72 alone, are alternately provided in an organic EL device 81 of the present embodiment. The first subpixel SPA is configured by six rows. Each of the rows includes these five recessed portions 52 and 72. The configuration of the second subpixel SPB and the third subpixel SPC is the same as that of the first subpixel SPA. In the case of the present embodiment, light propagating from the light-emitting region 53 in either the horizontal direction or vertical direction of FIG. 20 can also be extracted from the second recessed portions 72. As a result, light is emitted from all of the recessed portions 52 and 72 inside one subpixel.

Similar to the first to the fifth embodiment, in the present embodiment also, the organic EL device 81 having excellent light utilization efficiency can be realized. In the case of the present embodiment in particular, an organic EL display having high brightness at low power consumption can be realized.

An example has been given in the present embodiment in which each subpixel SPA, SPB, or SPC includes six rows including rows that include the first recessed portion 52 and second recessed portions 72 and rows that include only the second recessed portions 72. However, the number of recessed portions 52 and 72 and the number of rows of recessed portions 52 and 72 included in each subpixel SPA, SPB, or SPC may be appropriately modified. The planar shapes of the recessed portions 52 and 72 need not necessarily be rectangular, and may be freely-selected shapes.

Note that the technical scope of the present invention is not limited to the embodiments above, and various additional modifications may be made within a scope that does not exceed the spirit of the present invention.

Although a description has been given in the embodiments above regarding examples of cases in which the cross-section profile of the recessed portion is a parabolic line shape, the cross-section profile of the recessed portion need not necessarily be a parabolic line shape. The cross-section profile of the recessed portions may include, for example, a conical line such as an elliptical or a hyperbolic line, or the cross-section profile may include a curved line at the base portion side and a straight line at the upper portion side. The planar shape of the recessed portion is not limited to a circle or rectangle, and may be another shape. Moreover, the planar shapes of the recessed portions need not all be the same, and a plurality of types of recessed portions having shapes that differ from each other may be provided.

In the embodiments above, to have the light-emitting region in only the region of a portion of the recessed portions, configuration is made such that a first electrode, an organic layer, and a second electrode are provided to the entire surface of the base material, an opening is provided in an insulating layer, and the light-emitting region is defined by the opening. However, there is no limitation to this configuration. For example, without using an insulating layer, a configuration may be made such that at least one out of the first electrode, the organic layer, and the second electrode is only provided near the focal points of the recessed portions, and the light-emitting region itself may be restrictively formed. Examples have been given in the embodiments above in which the entire edge of the opening of the insulating layer is at the inside of the edge of the recessed portion. However, for example, a portion of the edge of the opening may protrude to the outside of the edge of the recessed portion.

In addition, specific configuration such as the shape, dimensions, number, disposition, configuration materials, and forming processes of each portion of the organic EL device are not limited to the embodiments above, and may be appropriately modified. Moreover, the organic EL device of the present invention may be applied to an illuminating device or the like other than a display device.

INDUSTRIAL APPLICABILITY

The present invention may be utilized in a freely-selected electrical device provided with a light-emitting portion such as a display device or an illuminating device.

REFERENCE SIGNS LIST 1, 41, 51, 61, 71, 81 Organic EL device
2 Base material
3 Reflective layer
4 First electrode
5 Organic layer
6 Second electrode
9, 52 (First) Recessed portion
10 Insulating layer
12 Filling layer
16 Light-emitting layer
35, 53 Light-emitting region
36, 54 Non-light-emitting region
42, 72 Second recessed portion
SPA, SPB, SPC Subpixel (unit display region)

What is claimed is:

1. An organic electroluminescent device comprising:
a base material;
a first recessed portion provided in an upper face of the base material;
a reflective layer provided along at least a surface of the first recessed portion and provided over a planar face of the base material, the planar face of the base material provided in a region of the upper face of the base material other than in a region where the first recessed portion is provided;
a filling layer having optical transparency, the filling layer being filled and disposed at an inside of the first recessed portion with the reflective layer interposed between the first recessed portion and the filling layer;
a first electrode having optical transparency, the first electrode being provided at least at an upper-layer side of the filling layer;
an organic layer including a light-emitting layer, the organic layer being provided at an upper-layer side of the first electrode; and
a second electrode having optical transparency and optical reflectivity, the second electrode having provided at an upper-layer side of the organic layer;
wherein a light-emitting region is formed by layers of the first electrode, the organic layer, and the second electrode and at least a portion of an edge of the light-emitting region is positioned further inside than an edge of the first recessed portion, as viewed in a direction normal to the upper face of the base material, and
wherein the reflective layer and the first electrode are in contact with each other at a periphery of the first recessed portion, and
wherein an upper face of the filling layer is positioned lower than a plane including a planar face of the reflective layer provided over the planar face of the base material.

2. The organic electroluminescent device according to claim 1,
wherein an insulating layer is provided at the upper-layer side of the first electrode and at a lower-layer side of the second electrode, the insulating layer including an opening at a position overlapping with the first recessed portion, as viewed in the direction normal to the upper face of the base material, and
wherein the light-emitting region is configured inside the opening by a layered body of the layers of the first electrode, the organic layer, and the second electrode.

3. The organic electroluminescent device according to claim 2,
wherein the entire edge of the opening is positioned inside the entire edge of the first recessed portion, as viewed in the direction normal to the upper face of the base material.

4. The organic electroluminescent device according to claim 2,
wherein a second recessed portion is provided in the upper face of the base material in a region where the insulating layer is formed, and
wherein the reflective layer is provided along a surface of the second recessed portion.

5. The organic electroluminescent device according to claim 4,
wherein, as viewed in the direction normal to the upper face of the base material, a plurality of the first recessed portions are provided at a spacing from each other in at least one azimuth direction, and
wherein one or a plurality of the second recessed portions are provided between two first recessed portions of the plurality of the first recessed portions, the two first recessed portions being adjacent to each other.

6. The organic electroluminescent device according to claim 1,
wherein at least a portion of a cross-section profile of the first recessed portion sectioned along at least one plane out of a plurality of planes orthogonal to the upper face of the base material includes a curved line including a focal point, and
wherein the focal point is positioned in an interior of the light-emitting region.

7. The organic electroluminescent device according to claim 6,
wherein the curved line is a parabolic line.

8. The organic electroluminescent device according to claim 1,
wherein a lower face of the first electrode in the first recessed portion is positioned lower than a plane including the upper face of the base material.

9. The organic electroluminescent device according to claim 8,
wherein a lower face of the light-emitting layer in the first recessed portion is positioned lower than a plane including the upper face of the base material.

10. The organic electroluminescent device according to claim 1, further comprising:
a plurality of unit display regions,
wherein the plurality of unit display regions each include at least the first recessed portion.

11. The organic electroluminescent device according to claim 10,
wherein the plurality of unit display regions are disposed in a matrix arrangement.

12. A method for producing an organic electroluminescent device, the method comprising:
forming a first recessed portion in an upper face of a base material;
forming a reflective layer along at least a surface of the first recessed portion;

forming a filling layer at an inside of the first recessed portion with the reflective layer interposed between the first recessed portion and the filling layer, the filling layer having optical transparency;

forming a first electrode at least at an upper-layer side of the filling layer, the first electrode having optical transparency;

forming, at an upper-layer side of the first electrode, an insulating layer including an opening at a position overlapping the first recessed portion, as viewed in a direction normal to the upper face of the base material;

forming an organic layer at an upper-layer side of the insulating layer or between the first electrode and the insulating layer, the organic layer including a light-emitting layer; and forming a second electrode at the upper-layer side of the organic layer or at an upper-layer side of the insulating layer, the second electrode having optical transparency and optical reflectivity;

a light-emitting region being configured inside the opening by a layered body of layers of the first electrode, the organic layer, and the second electrode, and, as viewed in the direction normal to the upper face of the base material, at least a portion of an edge of the light-emitting region being positioned further inside than an edge of the first recessed portion; and the reflective layer and the first electrode being in contact with each other at a periphery of the first recessed portion.

13. The organic electroluminescent device according to claim 1,
wherein the first electrode is formed across the upper face of the filling layer and the planar face of the reflective layer.

14. The organic electroluminescent device according to claim 1,
wherein the first electrode includes a step in a portion at the edge of the first recessed portion.

15. The organic electroluminescent device according to claim 1,
wherein a portion of the first electrode positioned at the upper face of the base material is in contact with a portion of the reflective layer.

16. The organic electroluminescent device according to claim 1,
wherein a lower face of the first electrode in the first recessed portion is positioned lower than the plane including the planar face of the reflective layer.

17. The organic electroluminescent device according to claim 2,
wherein the opening is smaller than the first recessed portion.

18. The organic electroluminescent device according to claim 2,
wherein a region where the insulating layer is interposed between the first electrode and the second electrode is a non-light-emitting region where emission of light from the light-emitting layer does not occur.

19. The organic electroluminescent device according to claim 4,
wherein the insulating layer does not include an opening at a position overlapping with the second recessed portion, and
wherein the first electrode and organic layer are not in contact with each other within the second recessed portion.

20. The organic electroluminescent device according to claim 14,
wherein an insulating layer is provided at the upper-layer side of the first electrode and at a lower-layer side of the second electrode, and
wherein the step is leveled by the insulating layer.

* * * * *